(12) United States Patent
Lee et al.

(10) Patent No.: US 11,804,848 B2
(45) Date of Patent: Oct. 31, 2023

(54) SPLIT INVERTER, CAPACITOR DIGITAL-TO-ANALOG CONVERTER AND ANALOG-TO-DIGITAL CONVERTER OF SUCCESSIVE APPROXIMATION REGISTER TYPE INCLUDING SAME

(71) Applicant: Samsung Electronics Co., Ltd., Suwon-si (KR)

(72) Inventors: Jaehoon Lee, Suwon-si (KR); Yong Lim, Seoul (KR); Seunghyun Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 31 days.

(21) Appl. No.: 17/705,776

(22) Filed: Mar. 28, 2022

(65) Prior Publication Data
US 2022/0407538 A1  Dec. 22, 2022

(30) Foreign Application Priority Data
Jun. 16, 2021  (KR) .......... 10-2021-0078019

(51) Int. Cl.
*H03M 1/34* (2006.01)
*H03M 1/46* (2006.01)
(Continued)

(52) U.S. Cl.
CPC ...... *H03M 1/466* (2013.01); *H03K 3/356104* (2013.01); *H03M 1/1245* (2013.01); *H03M 1/462* (2013.01)

(58) Field of Classification Search
CPC .......... H03M 1/466; H03M 1/356104; H03M 1/1245; H03M 1/462
(Continued)

(56) References Cited

U.S. PATENT DOCUMENTS 4,384,274 A * 5/1983 Mao .................. H03M 1/16
341/135
4,594,577 A * 6/1986 Mao .................. G10L 15/12
341/138
(Continued)

FOREIGN PATENT DOCUMENTS

KR  10-2090205 B1  3/2020
KR  10-2123277 B1  6/2020

*Primary Examiner* — Peguy Jean Pierre
(74) *Attorney, Agent, or Firm* — Harness, Dickey & Pierce, P.L.C.

(57) ABSTRACT

An analog-to-digital converter of successive approximation register (SAR) type includes a comparator, a SAR logic circuit, and a capacitor digital-to-analog converter. The capacitor digital-to-analog converter includes a plurality of drivers. Each driver includes a capacitor and a split inverter. A first capacitor node of the capacitor is connected to one of comparison input terminals. The split inverter includes a pull-up unit connected to a first reference voltage and a pull-down unit connected to a second reference voltage. The split inverter drives a second capacitor node of the capacitor by selectively turning on one of the pull-up unit and the pull-down unit. A first one of the pull-up unit and the pull-down unit includes a full transistor, and a second one of the pull-up unit and the pull-down unit includes a first split transistor and a second split transistor. A short current is reduced using the split inverter.

20 Claims, 21 Drawing Sheets

(51) Int. Cl.
*H03K 3/356* (2006.01)
*H03M 1/12* (2006.01)

(58) Field of Classification Search
USPC .................................. 341/146, 155, 144, 163
See application file for complete search history.

(56) References Cited

U.S. PATENT DOCUMENTS

| | | |
|---|---|---|
| 8,395,420 B2 | 3/2013 | Nakagawa |
| 10,079,609 B2 | 9/2018 | Fan |
| 10,389,377 B1 | 8/2019 | Thasari et al. |
| 10,574,254 B2 | 2/2020 | Lee et al. |
| 10,727,856 B2 | 7/2020 | Wu et al. |
| 11,184,019 B1* | 11/2021 | Vecera .................. H03M 3/424 |
| 2023/0100170 A1* | 3/2023 | Beccue .......... H03K 19/018521 |
| | | 327/333 |

* cited by examiner

FIG. 21

| COMPARISON ITEM | NINV | SINV | ratio(%) |
|---|---|---|---|
| average current (uA) | 1 | 0.558 | 55.8 |
| Reset current * time (mA*t) | 1 | 0.558 | 55.8 |
| 4 conversions(1st+2nd+3rd+4th) | 1 | 0.79 | 79 |
| 1st conversion | 1 | 0.774 | 77.4 |
| 4th conersion | 1 | 0.831 | 83.1 |

SPLIT INVERTER, CAPACITOR DIGITAL-TO-ANALOG CONVERTER AND ANALOG-TO-DIGITAL CONVERTER OF SUCCESSIVE APPROXIMATION REGISTER TYPE INCLUDING SAME

CROSS-REFERENCE TO RELATED APPLICATION

This U.S. non-provisional application claims priority under 35 USC § 119 to Korean Patent Application No. 10-2021-0078019, filed on Jun. 16, 2021, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a split inverter, a capacitor digital-to-analog inverter and an analog-to-digital converter of successive approximation register (SAR) type including the split inverter.

2. Discussion of the Related Art

An analog-to-digital converter converts an analog input signal into a digital output signal. For example, a wireless communication system may use an analog-to-digital converter to convert a received radio frequency (RF) signal into a baseband signal and generate a digital output signal based on an analog baseband signal. Examples of the analog-to-digital converter may include a flash-type analog-to-digital converter, a successive approximation register (SAR) type analog-to-digital converter, a sigma delta analog-to-digital converter, and the like, and each type may be used in a field according to the characteristics thereof. The flash-type analog-to-digital converter has faster operation speed, but includes $2^n$ comparators to provide n-bit digital output signals. Thus, the flash-type analog-to-digital converter consumes a large amount of power and has a large implementation area. The sigma delta analog-to-digital converter has a high signal-to-noise ratio (SNR), but a feedback gain of a delta modulator including passive elements is fixed to 1. Compared with the flash-type analog-to-digital converter, the SAR-type analog-to-digital converter has low operation speed, but includes only one comparator. Thus, the SAR-type analog-to-digital converter may reduce power consumption and implementation area. Various electronic devices include many analog-to-digital converters and the power consumption and occupation area may be increased as the number of the analog-to-digital converters increase.

SUMMARY

Some example embodiments may provide a split inverter capable of reducing power consumption, a capacitor digital-to-analog converter and an analog-to-digital converter of successive approximation register (SAR) type including the split inverter.

According to example embodiments, an analog-to-digital converter of successive approximation register (SAR) type is configured to perform a binary search conversion to sequentially determine from a most significant bit to a least significant bit of a plurality of bits of a digital output signal corresponding to an analog input signal. The analog-to-digital converter includes a comparator, a SAR logic circuit, and a capacitor digital-to-analog converter. The comparator generates a comparison signal by comparing comparison input voltages of comparison input terminals. The SAR logic circuit generates a plurality of control signals based on the comparison signal to control the binary search conversion. The capacitor digital-to-analog converter includes a plurality of drivers configured to control the comparison input voltages based on a first reference voltage, a second reference voltage lower than the first reference voltage and the plurality of control signals. Each driver of the plurality of drivers includes a capacitor and a split inverter. A first capacitor node of the capacitor is connected to one of the comparison input terminals. The split inverter includes a pull-up unit connected to the first reference voltage and a pull-down unit connected to the second reference voltage. The split inverter drives a second capacitor node of the capacitor by selectively turning on one of the pull-up unit and the pull-down unit. A first one of the pull-up unit and the pull-down unit includes a full transistor, and a second one of the pull-up unit and the pull-down unit includes a first split transistor and a second split transistor.

According to example embodiments, a capacitor digital-to-analog converter included in an analog-to-digital converter of successive approximation register (SAR) type, includes, a plurality of drivers. Each driver of the plurality of drivers includes a capacitor and a split inverter. A first capacitor node of the capacitor is connected to one of the comparison input terminals. The split inverter includes a pull-up unit connected to the first reference voltage and a pull-down unit connected to the second reference voltage. The split inverter drives a second capacitor node of the capacitor by selectively turning on one of the pull-up unit and the pull-down unit. A first one of the pull-up unit and the pull-down unit includes a full transistor, and a second one of the pull-up unit and the pull-down unit includes a first split transistor and a second split transistor.

According to example embodiments, a split inverter includes a pull-up unit connected between a first reference voltage and an output node and a pull-down unit connected between a second reference voltage lower than the first reference voltage and the output node. A first one of the pull-up unit and the pull-down unit includes a full transistor, and a second one of the pull-up unit and the pull-down unit includes a first split transistor and a second split transistor. The full transistor and the first split transistor are turned on complementarily based on a control signal, and the second split transistor is turned on, independently of the first split transistor, based on an impedance control signal.

The split inverter according to example embodiments may reduce a short current by dividing one of the pull-up unit and the pull-down unit into at least two split transistors and controlling the switching timings of the split transistors.

The capacitor digital-to-analog converter and the analog-to-digital converter of the SAR type according to example embodiments may reduce power consumption by reducing the short current using the split inverter. The operation speed of devices such as the analog-to-digital converter including the capacitor digital-to-analog converter may be enhanced without influence on the switching timings of the analog-to-digital converter.

In addition, the capacitor digital-to-analog converter and the analog-to-digital converter according to example embodiments may reduce size of devices including the analog-to-digital converter by reducing a size of decoupling capacitor for a reference voltage generator.

BRIEF DESCRIPTION OF THE DRAWINGS

Example embodiments of the present disclosure will be more clearly understood from the following detailed description taken in conjunction with the accompanying drawings.

FIGS. 19, 20 and 21 are diagram illustrating effects of an analog-to-digital converter of SAR type according to example embodiments.

DETAILED DESCRIPTION OF EMBODIMENTS

Figure 1:
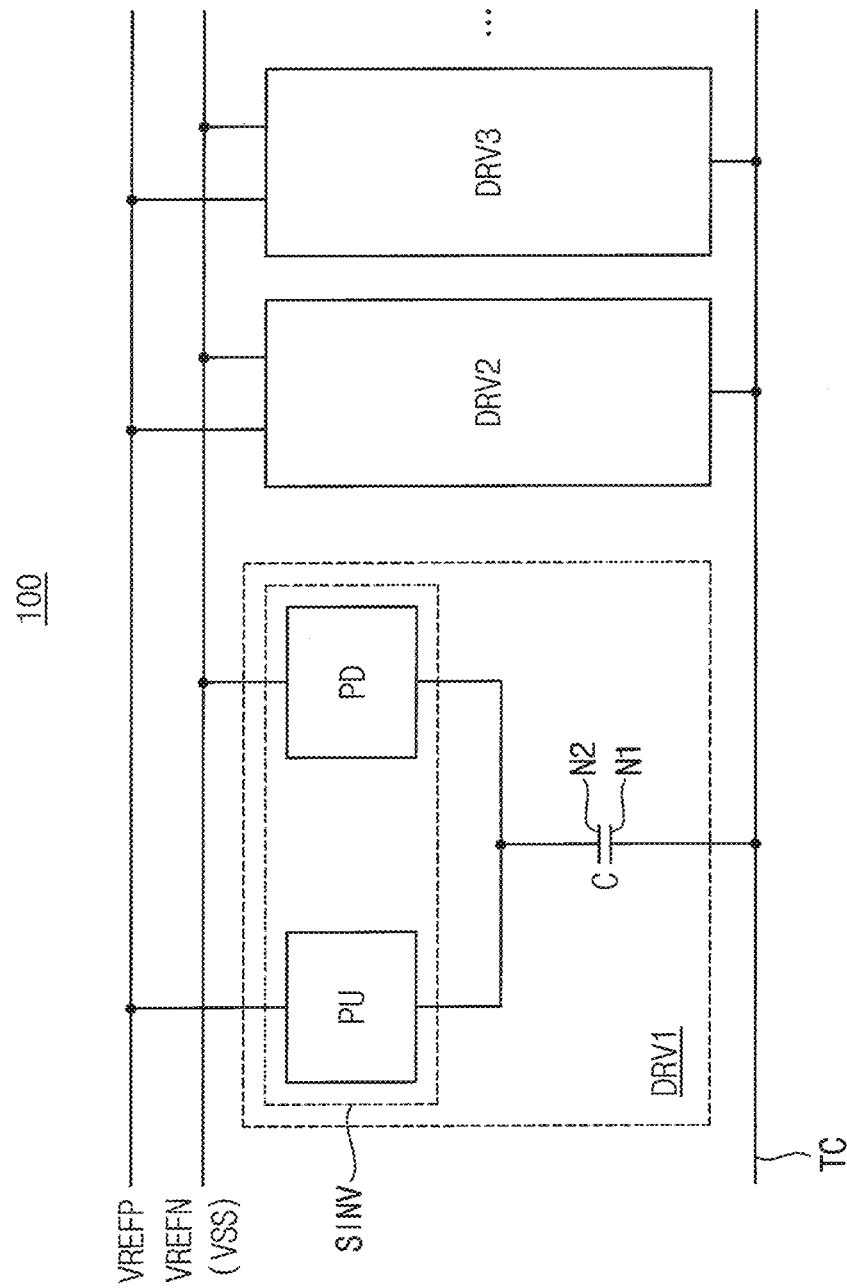
FIG. 1 is a diagram illustrating a capacitor digital-to-analog converter according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a diagram illustrating a capacitor digital-to-analog converter according to example embodiments.

Referring to FIG. 1, a capacitor digital-to-analog converter CDAC 100 may include a plurality of drivers DRV1~DRV3. As will be described below with reference to FIGS. 12 through 15, the CDAC 100 may be included in an analog-to-digital converter of successive approximation register (SAR) type, which may perform a binary search conversion to sequentially determine from a most significant bit to a least significant bit of a plurality of bits of a digital output signal corresponding to an analog input signal.

Each driver of the plurality of drivers DRV1~DRV3 may include a capacitor C and a split inverter SINV. FIG. 1 illustrates three drivers and a configuration of one driver DRV for convenience of illustration. The number of drivers may be determined variously, and the configuration of the other drivers DRV2 and DRV3 may be the same as or similar to the illustrated configuration of the driver DRV1.

The capacitor may include a first capacitor node N1 connected to a control terminal TC and a second capacitor node N2 connected to the split inverter SINV. The control terminal TC may be one of comparison input terminals if a comparator included in an analog-to-digital converter as will be described below. For example, the control terminal TC may be a positive input terminal or a negative input terminal of the comparator.

The split inverter SINV may include a pull-up unit PU connected to a first reference voltage VREFP and a pull-down unit PD connected to a second reference voltage VREFN lower than the first reference voltage VREFP. For example, the first reference voltage VREFP may have a positive voltage level, and the second reference voltage VREFN may be a ground voltage VSS. As will be described below, the split inverter SINV may drive the second capacitor node N2 by selectively turning on one of the pull-up unit PU and the pull-down unit PD.

A first one of the pull-up unit PU and the pull-down unit PD may include a full transistor, and a second one of the pull-up unit PU and the pull-down unit PD may include a first split transistor and a second split transistor.

In some example embodiments, as will be described below with reference to FIGS. 3 through 6, the pull-up unit PU may include one full P-type metal oxide semiconductor (PMOS) transistor and the pull-down unit PD may include a first split N-type metal oxide semiconductor (NMOS) transistor and a second split NMOS transistor.

In some example embodiments, as will be described below with reference to FIGS. 7 through 10, the pull-up unit PU may include a first split PMOS transistor and a second split PMOS transistor and the pull-down unit PD may include one full NMOS transistor.

Hereinafter, configuration and operation of the split inverter SINV are described with reference to FIGS. 2 through 10. The drivers DRV1~DRV3 included in the CDAC 100 of FIG. 1 may be implemented split inverters as will be described below with reference to FIGS. 2 through 10.

Figure 2:
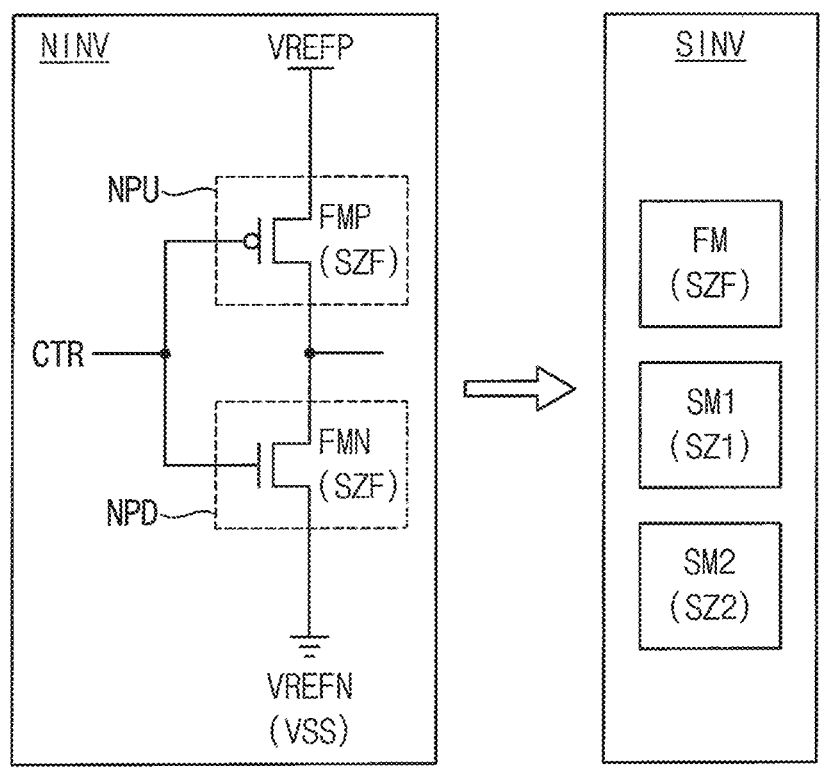
FIG. 2 is a diagram for describing a split inverter according to example embodiments.

FIG. 2 is a diagram for describing a split inverter according to example embodiments.

Referring to FIG. 2, a normal inverter NINV in a driver may be substituted with a split inverter SINV.

In general, the normal inverter may include one full PMOS transistor FMP having a full size SZF and one NMOS transistor FMN having the full size SZF. The full size SZF of the full PMOS transistor FMP may be equal to or different from the full size SZF of the full NMOS transistor FMN. Here, a size of a transistor may indicate a ratio W/L of a width W of a transistor channel with respect to a length L of the transistor channel.

In the normal inverter NINV, the full PMOS transistor FMP corresponds to the pull-up unit PU and the full NMOS transistor FMN corresponds to the pull-down unit PD. A control signal CTR may be applied commonly to gates electrodes of the full PMOS transistor FMP and the full NMOS transistor FMN, and one of the full PMOS transistor FMP and the full NMOS transistor FMN may be turned on depending on the voltage level of the control signal CTR.

In contrast, the split inverter SINV may include one full transistor FM having the full size SZF, a first split transistor SM1 having a first size SZ1 and a second split transistor SM2 having a second size SZ2. As will be described below, a control signal may be applied commonly to gate electrodes of the full transistor FM and the first split transistor SM1, and the full transistor FM and the first split transistor SM1 may be turned on complementarily based on the control signal. A impedance control signal may be applied to the second split transistor SM2 and the second split transistor SM2 may be turned on, independently of the first split transistor SM, based on an impedance control signal.

In some example embodiments, as will be described below with reference to FIGS. 3 through 6, the full transistor FM in the pull-up unit of the split inverter SINV may be the same as the full PMOS transistor FMP in the pull-up unit PU of the normal inverter NIVM. In some example embodiments, the full NMOS transistor in the pull-down unit PD of the normal inverter NINV may be divided into the first split transistor SM1 and the second split transistor SM2 included in the pull-down unit of the split inverter SINV. The sum of the first size SZ1 of the first split transistor SM1 and the second size SZ2 of the second split transistor SM2 may be equal to the full size SZF of the full NMOS transistor FMN of the normal inverter NINV. The first size SZ1 of the first split transistor SM1 may be smaller than the full size SZF of the full transistor FM.

In some example embodiments, as will be described below with reference to FIGS. 7 through 10, the full transistor FM in the pull-down unit of the split inverter SINV may be the same as the full NMOS transistor FMN in the pull-down unit PD of the normal inverter NIVM. In some example embodiments, the full PMOS transistor in the pull-up unit PU of the normal inverter NINV may be divided into the first split transistor SM1 and the second split transistor SM2 included in the pull-up unit of the split inverter SINV. The sum of the first size SZ1 of the first split transistor SM1 and the second size SZ2 of the second split transistor SM2 may be equal to the full size SZF of the full PMOS transistor FMP of the normal inverter NINV. The first size SZ1 of the first split transistor SM1 may be smaller than the full size SZF of the full transistor FM.

As such, a short current of a short circuit current due to slew of the inverter input signal may be reduced by decreasing the size ratio SM1/SZF of the first split transistor SM1 and the full transistor FM to be lower than one. However, the impedance imposed to the control terminal TC may be changed according to whether the full transistor FM and the first split transistor SM1 is turned on, and thus the signal-to-noise ratio of the analog-to-digital converter including the inverter may be degraded by kickback of the comparator in the analog-to-digital converter.

To solve such problem, the impedance may be matched using the second split transistor SM2. As such, one of the pull-up unit PU and the pull-down unit PD may be split into two split transistors and switching timings of the split transistors may be controlled properly to reduce the short current without degradation of performance.

In example embodiments of the inverter used in the capacitor digital-to-analog converter, the signal transitions may be predetermined or alternatively, desired and it may be determined whether to split the pull-up unit PU or the pull-down unit PD.

Figure 3:
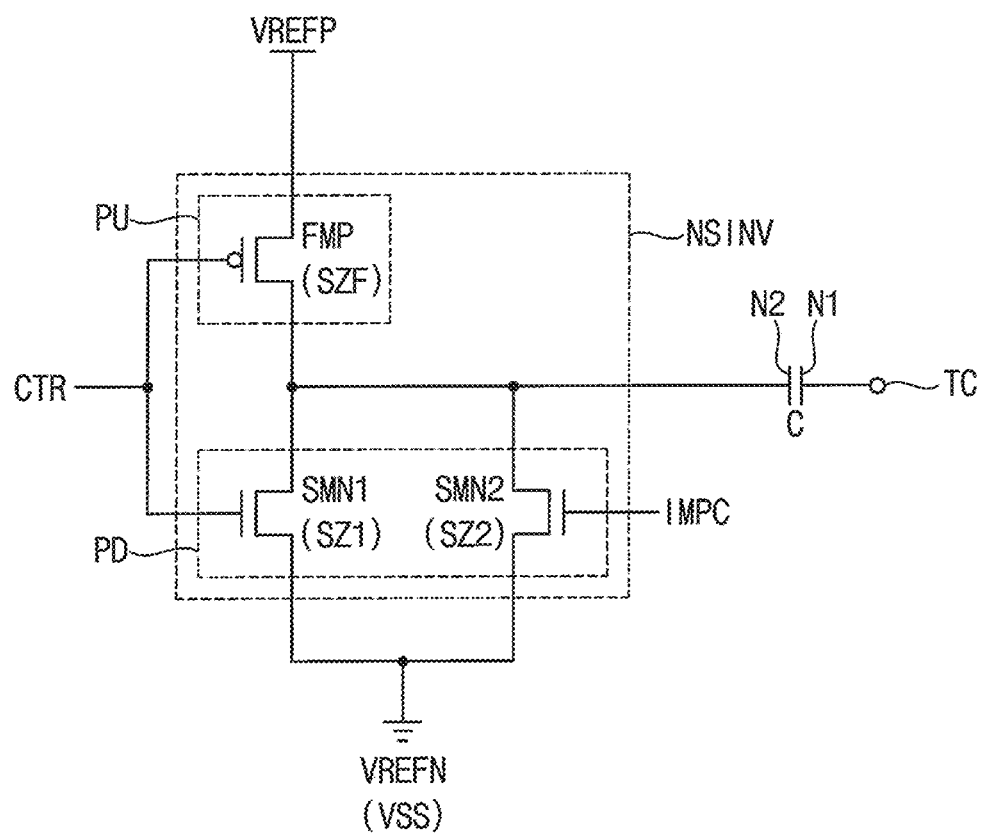
FIG. 3 is a circuit diagram illustrating an N-type split inverter according to example embodiments.
Figure 4:
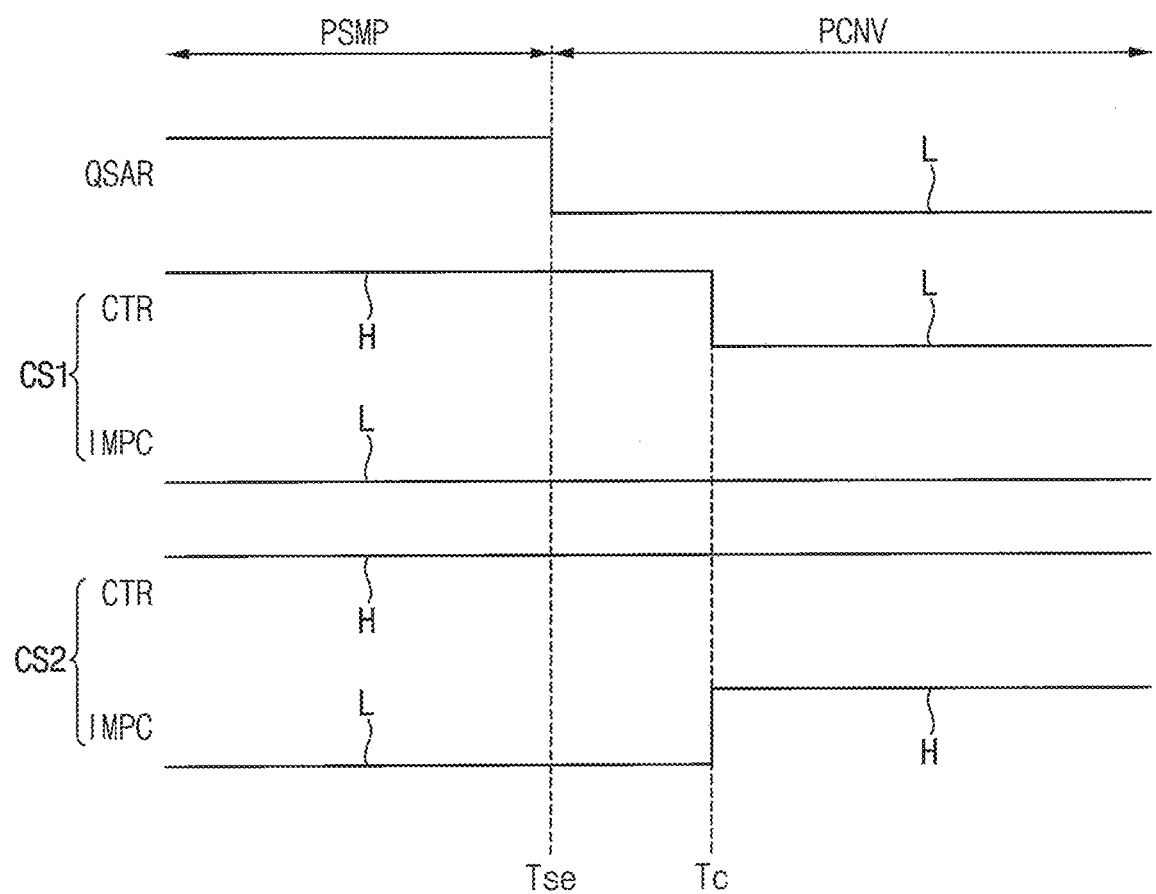
FIG. 4 is a timing diagram illustrating an operation of the N-type split inverter of FIG. 3.

FIG. 3 is a circuit diagram illustrating an N-type split inverter according to example embodiments, and FIG. 4 is a timing diagram illustrating an operation of the N-type split inverter of FIG. 3. Also the capacitor C is illustrated in FIG. 3 and the second capacitor node N2 corresponds to an output node of an N-type split inverter NSINV.

Referring to FIG. 3, an N-type split inverter NSINV may include a pull-up unit PU and a pull-down unit PD. The pull-up unit PU may include a full PMOS transistor FMP and the pull-down unit PD may include a first split NMOS transistor SMN1 and a second split NMOS transistor SMN2.

The full PMOS transistor FMP may be connected between the first reference voltage VREFP and the second capacitor node N2 corresponding to the output node and the control signal CTR may be applied to the gate electrode of the full PMOS transistor FMP.

The first split NMOS transistor SMN1 may be connected between the second reference voltage VREFN and the second capacitor node N2 and the control signal CTR may be applied to the gate electrode of the first split NMOS transistor SMN1.

The second split NMOS transistor SMN2 may be connected between the second reference voltage VREFN and the second capacitor node N2 and the impedance control signal IMPC may be applied to the gate electrode of the second split NMOS transistor SMN2.

The full PMOS transistor FMP in the pull-up unit PU of the N-type split inverter NSINV may be equal to the full PMOS transistor FMP in the pull-up unit PU of the normal inverter NINV of FIG. 2. In some example embodiments, the full NMOS transistor in the pull-down unit PD of the normal inverter NINV may be split into the first split NMOS transistor SMN1 and the second split NMOS transistor SMN2 in the pull-down unit PD of the N-type split inverter NSINV. The sum of the first size SZ1 of the first split NMOS transistor SMN1 and the second size SZ2 of the second split NMOS transistor SMN2 may be equal to the full size SZF of the full NMOS transistor FMN of the normal inverter NINV. The first size SZ1 of the first NMOS transistor SMN1 may be smaller than the full size SZF of the full PMOS transistor FMP.

The control signal CTR may be applied commonly to the gate electrodes of the full PMOS transistor FMP and the first split NMOS transistor SMN1. Accordingly the full PMOS transistor FMP and the first split NMOS transistor SMN1 may be turned on complimentarily based on the control signal CTR. The second split NMOS transistor SMN2 may be turned on, independently of the first split NMOS transistor SMN1, based on the impedance control signal IMPC.

FIG. 4 illustrates an operation when the N-type split inverter NSINV is applied to an analog-to-digital converter of SAR type.

In FIG. 4, PSMP indicates a sampling period of the SAR-type analog-to-digital converter and PCNV indicates a conversion period of the SAR-type analog-to-digital converter. The sampling period PSMP and the conversion period PCNV for the binary search conversion will be described with reference to FIGS. 13 through 15. In FIG. 4, a first case CS1 corresponds to a case that the logic level of the control signal CTR is transitioned by the conversion operation, and a second case CS2 corresponds to a case that the logic level of the control signal CTR is maintained by the conversion operation.

Referring to FIGS. 3 and 4, a SAR logic circuit, which will be further described with reference to FIG. 12, may reset the control signal CTR to the logic high level H and reset the impedance control signal IMPC to the logic low level L such that the full PMOS transistor FMP and the second split NMOS transistor SMN2 may be turned off and the first split NMOS transistor SMN1 may be turned on before the binary search conversion, that is, during the sampling period PSMP.

In the conversion period PCNV, when the control signal CTR is transitioned by the conversion operation from the reset logic high level H to the logic low level L as the first case CS1, the impedance control signal IMPC may maintain the reset logic low level L. Accordingly, after the control signal CTR is transitioned, the full PMOS transistor FMP may be turned on, the first split NMOS transistor SMN1 may be turned off and the second split NMOS transistor SMN2 may maintain the turned-off state corresponding the reset state.

As described above, the first size SZ1 of the first split NMOS transistor SMN1 may be smaller than the full size SZF of the full PMOS transistor FMP. The short current that may be generated when the control signal CTR transitions may be reduced as will be described below with reference to FIGS. 5 and 6, by reducing the first size SZ1 of the first split NMOS transistor SMN1.

In the conversion period PCNV, when the control signal CTR is maintained in the reset logic high level H by the conversion operation as the second case CS2, the impedance control signal IMPC may be transitioned from the reset logic low level L to the logic high level H. Accordingly, after the impedance control signal IMPC is transitioned, the full PMOS transistor FMP may maintain the turned-off state corresponding to the reset state, the first split NMOS transistor SMN1 may maintain the turned-on state corresponding to the reset state and the second split NMOS transistor SMN2 may be turned on.

As described above, the sum SZ1+SZ2 of the first size SZ1 of the first split NMOS transistor SMN1 and the second size SZ2 of the second split NMOS transistor SMN2 may be equal to the full size SZF of the full NMOS transistor FMN of the normal inverter NINV of FIG. 2. Accordingly the composite turn-on resistance of the first split NMOS transistor SMN1 and the second split NMOS transistor SMN2 may be equal to the turn-on resistance of the full NMOS transistor FMN. As a result, in the second case CS2 when the first split NMOS transistor SMN1 maintain the turned-on state corresponding to the reset state, the second split NMOS transistor SMN2 may be turned on additionally and thus the impedance imposed to the control terminal TC may be controlled to be the same as a case of the normal inverter NINV.

Figure 5:
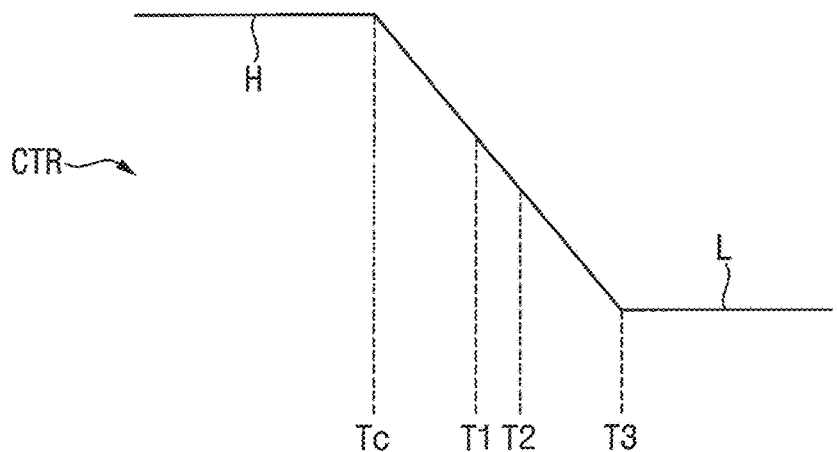
FIGS. 5 and 6 are diagrams illustrating short current reduction of the N-type split inverter of FIG. 3.
Figure 6:
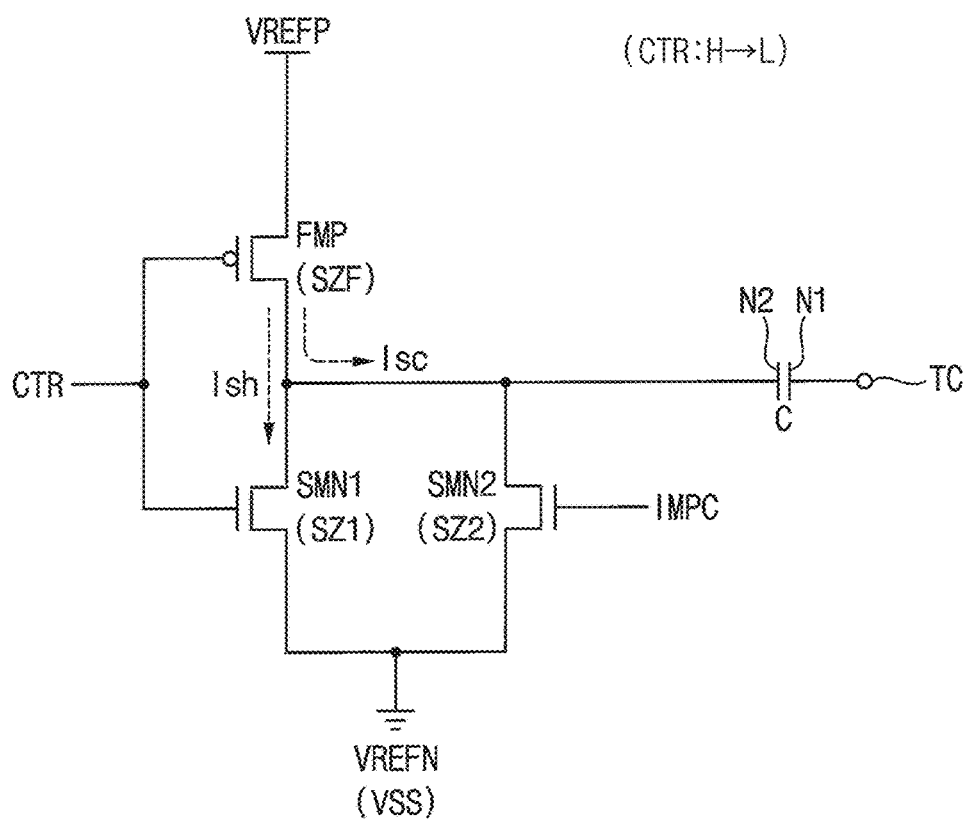

FIGS. 5 and 6 are diagrams illustrating short current reduction of the N-type split inverter of FIG. 3.

Referring to FIGS. 5 and 6, the control signal CTR may transition from the logic high level H to the logic low level L during time interval Tc~T3, for example, with a constant slew rate. According to transitioning of the control signal CTR, the first split NMOS transistor SMN1 that is reset to the turned-on state may be turned off and the full PMOS transistor FMP that is reset to the turned-off state may be turned on. Through such switching operation, the sourcing current Isc may flow from the first reference voltage VREFP to the second capacitor node N2 and the voltage of the second capacitor node N2 may be pulled up from the second reference voltage VREFN to the first reference voltage VREFP. The second split NMOS transistor SMN2 may maintain the turned-off state corresponding to the reset state.

The full PMOS transistor FMP may start being turned on at time point T1 and the first split NMOS transistor SMN1 may be completely turned off at time point T2. In other words, both of the full PMOS transistor FMP and the first split NMOS transistor SMN1 may be turned on partially during time interval T1~T2, and thus a short current Ish flowing from the first reference voltage VREFP to the second reference voltage VREFN may be generated during time interval T1~T2.

As described above, the sum of the first size SZ1 of the first split NMOS transistor SMN1 and the second size SZ2 of the second split NMOS transistor SMN2 may be equal to the full size SZF of the full NMOS transistor FMN of the normal inverter NINV. For example, the division ratio of the first size SZ1 and the second size SZ2 may be 1:3, and in some example embodiments, the first size SZ1 becomes ¼ of the full size SZF. As such, the turn-of resistance of the first split NMOS transistor SMN1 may be increased by reducing the first size of the first split NMOS transistor SMN1, and thus the short current Ish flowing through the first split NMOS transistor SMN1 may be reduced.

Figure 7:
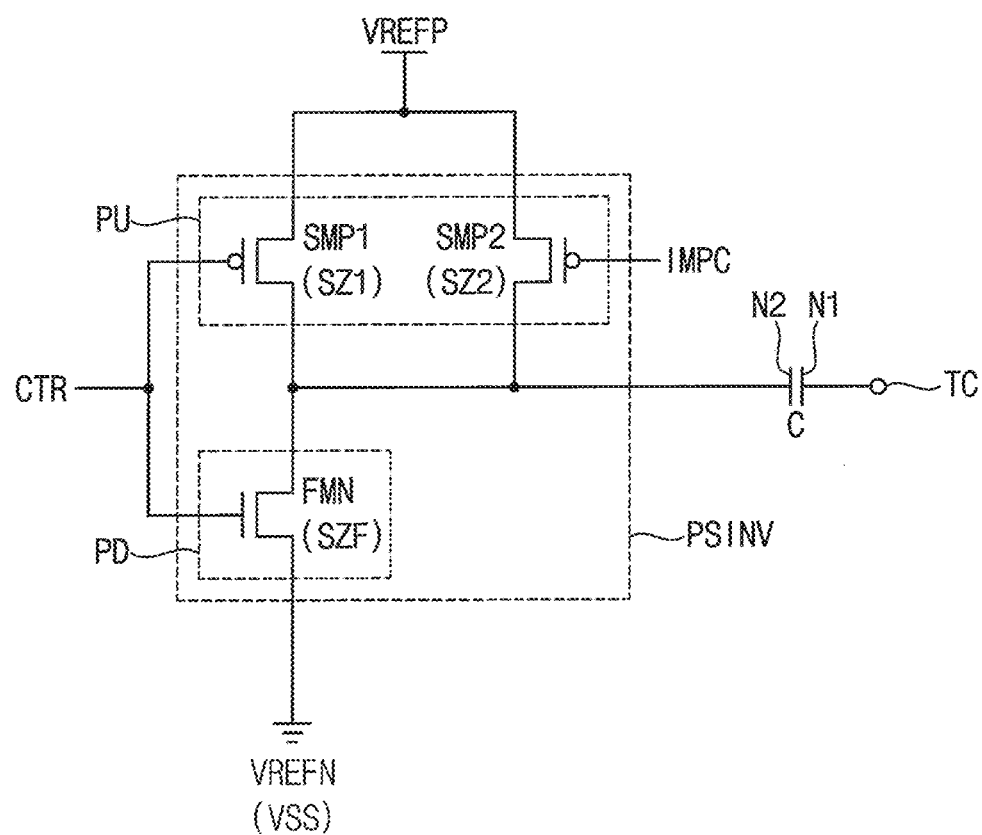
FIG. 7 is a circuit diagram illustrating a P-type split inverter according to example embodiments.
Figure 8:
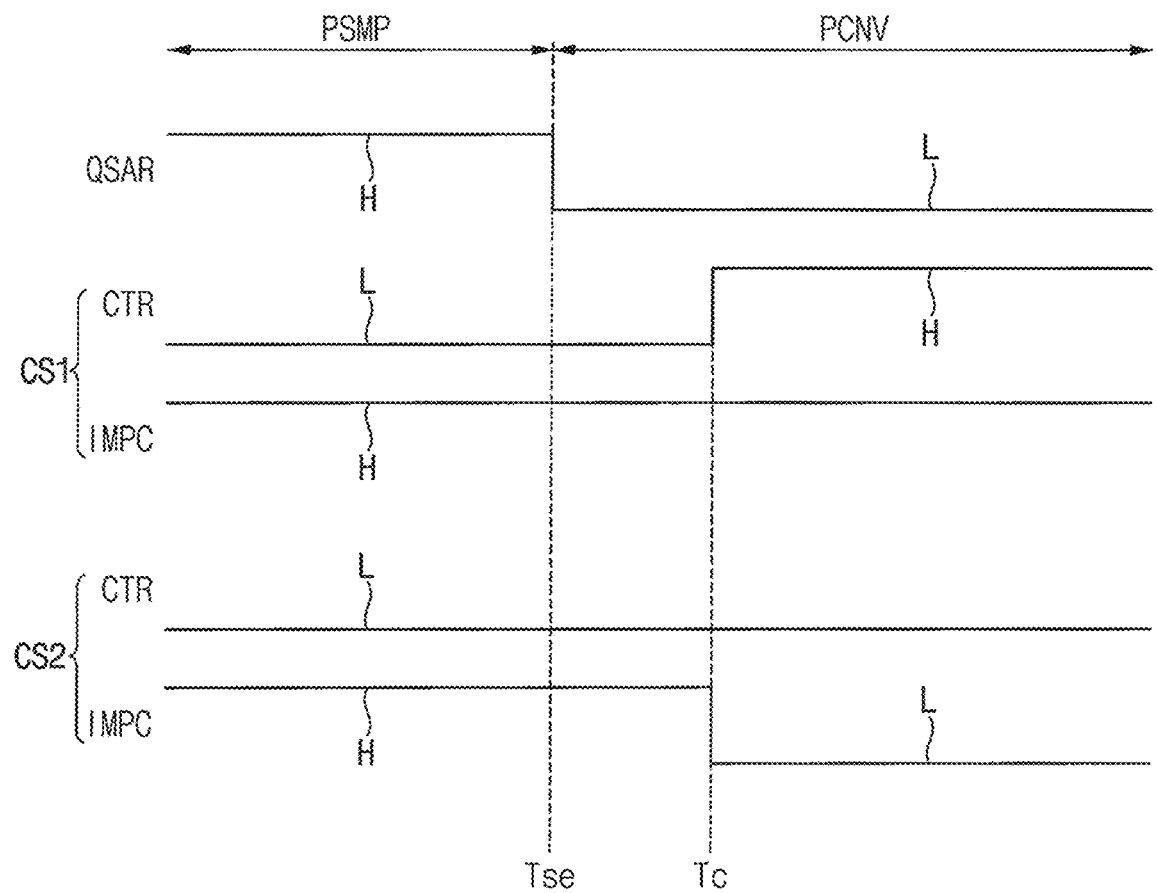
FIG. 8 is a timing diagram illustrating an operation of the P-type split inverter of FIG. 7.

FIG. 7 is a circuit diagram illustrating a P-type split inverter according to example embodiments, and FIG. 8 is a timing diagram illustrating an operation of the P-type split inverter of FIG. 7. Also the capacitor C is illustrated in FIG. 7 and the second capacitor node N2 corresponds to an output node of an P-type split inverter PSINV.

Referring to FIG. 7, a P-type split inverter PSINV may include a pull-up unit PU and a pull-down unit PD. The pull-up unit PU may include a first split PMOS transistor SMP1 and a second split PMOS transistor SMP2 and the pull-down unit PD may include a full NMOS transistor FMN.

The first split PMOS transistor SMP1 may be connected between the first reference voltage VREFP and the second capacitor node N2 corresponding to the output node and the control signal CTR may be applied to the gate electrode of the first split PMOS transistor SMP1.

The second split PMOS transistor SMP2 may be connected between the first reference voltage VREFP and the second capacitor node N2 and the impedance control signal IMPC may be applied to the gate electrode of the second split PMOS transistor SMP2.

The full NMOS transistor FMN may be connected between the second reference voltage VREFN and the second capacitor node N2 and the control signal CTR may be applied to the gate electrode of the full NMOS transistor FMN.

The full NMOS transistor FMN in the pull-down unit PD of the P-type split inverter PSINV may be equal to the full NMOS transistor FMN in the pull-down unit PD of the normal inverter NINV of FIG. 2. In some example embodiments, the full PMOS transistor in the pull-up unit PU of the normal inverter NINV may be split into the first split PMOS transistor SMP1 and the second split PMOS transistor SMP2 in the pull-up unit PU of the P-type split inverter PSINV. The sum of the first size SZ1 of the first split PMOS transistor SMP1 and the second size SZ2 of the second split PMOS transistor SMP2 may be equal to the full size SZF of the full PMOS transistor FMP of the normal inverter NINV. The first size SZ1 of the first split PMOS transistor SMP1 may be smaller than the full size SZF of the full NMOS transistor FMN.

The control signal CTR may be applied commonly to the gate electrodes of the full NMOS transistor FMN and the first split PMOS transistor SMP1. Accordingly the full NMOS transistor FMN and the first split PMOS transistor SMP1 may be turned on complimentarily based on the control signal CTR. The second split PMOS transistor SMP2 may be turned on, independently of the first split PMOS transistor SMP1, based on the impedance control signal IMPC.

FIG. 8 illustrates an operation when the P-type split inverter PSINV is applied to an analog-to-digital converter of SAR type.

In FIG. 8, PSMP indicates a sampling period of the SAR-type analog-to-digital converter and PCNV indicates a conversion period of the SAR-type analog-to-digital converter. The sampling period PSMP and the conversion period PCNV for the binary search conversion will be described with reference to FIGS. 13 through 15. In FIG. 8, a first case CS1 corresponds to a case that the logic level of the control signal CTR is transitioned by the conversion operation, and a second case CS2 corresponds to a case that the logic level of the control signal CTR is maintained by the conversion operation.

Referring to FIGS. 7 and 8, a SAR logic circuit, which will be further described with reference to FIG. 12, may reset the control signal CTR to the logic low level L and reset the impedance control signal IMPC to the logic high level H such that the full NMOS transistor FMN and the second split PMOS transistor SMP2 may be turned off and the first split PMOS transistor SMP1 may be turned on before the binary search conversion, that is, during the sampling period PSMP.

In the conversion period PCNV, when the control signal CTR is transitioned by the conversion operation from the reset logic low level L to the logic high level H as the first case CS1, the impedance control signal IMPC may maintain the reset logic high level H. Accordingly, after the control signal CTR is transitioned, the full NMOS transistor FMN may be turned on, the first split PMOS transistor SMP1 may be turned off and the second split PMOS transistor SMP2 may maintain the turned-off state corresponding the reset state.

As described above, the first size SZ1 of the first split PMOS transistor SMP1 may be smaller than the full size SZF of the full NMOS transistor FMN. The short current that may be generated when the control signal CTR transitions may be reduced as will be described below with reference to FIGS. 9 and 10, by reducing the first size SZ1 of the first split PMOS transistor SMP1.

In the conversion period PCNV, when the control signal CTR is maintained in the reset logic low level L by the conversion operation as the second case CS2, the impedance control signal IMPC may be transitioned from the reset logic high level H to the logic low level L. Accordingly, after the impedance control signal IMPC is transitioned, the full NMOS transistor FMN may maintain the turned-off state corresponding to the reset state, the first split PMOS transistor SMP1 may maintain the turned-on state corresponding to the reset state and the second split PMOS transistor SMP2 may be turned on.

As described above, the sum SZ1+SZ2 of the first size SZ1 of the first split PMOS transistor SMP1 and the second size SZ2 of the second split PMOS transistor SMP2 may be equal to the full size SZF of the full PMOS transistor FMP of the normal inverter NINV of FIG. 2. Accordingly the composite turn-on resistance of the first split PMOS transistor SMP1 and the second split PMOS transistor SMP2 may be equal to the turn-on resistance of the full PMOS transistor FMP. As a result, in the second case CS2 when the first split PMOS transistor SMP1 maintain the turned-on state corresponding to the reset state, the second split PMOS transistor SMP2 may be turned on additionally and thus the impedance imposed to the control terminal TC may be controlled to be the same as a case of the normal inverter NINV.

Figure 9:
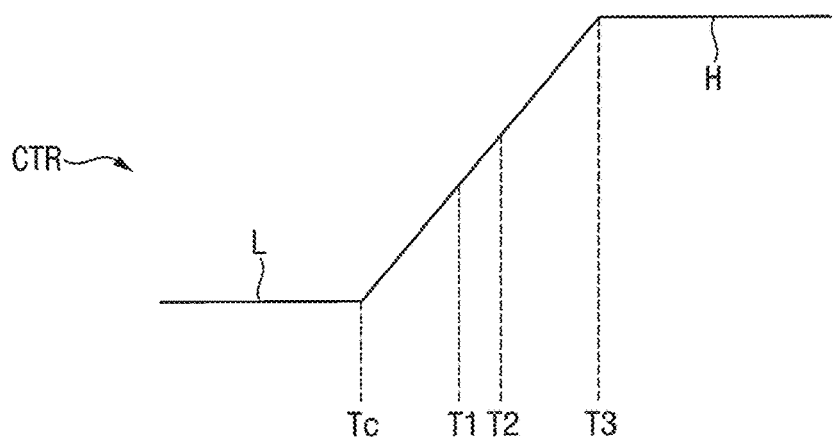
FIGS. 9 and 10 are diagrams illustrating short current reduction of the P-type split inverter of FIG. 7.
Figure 10:
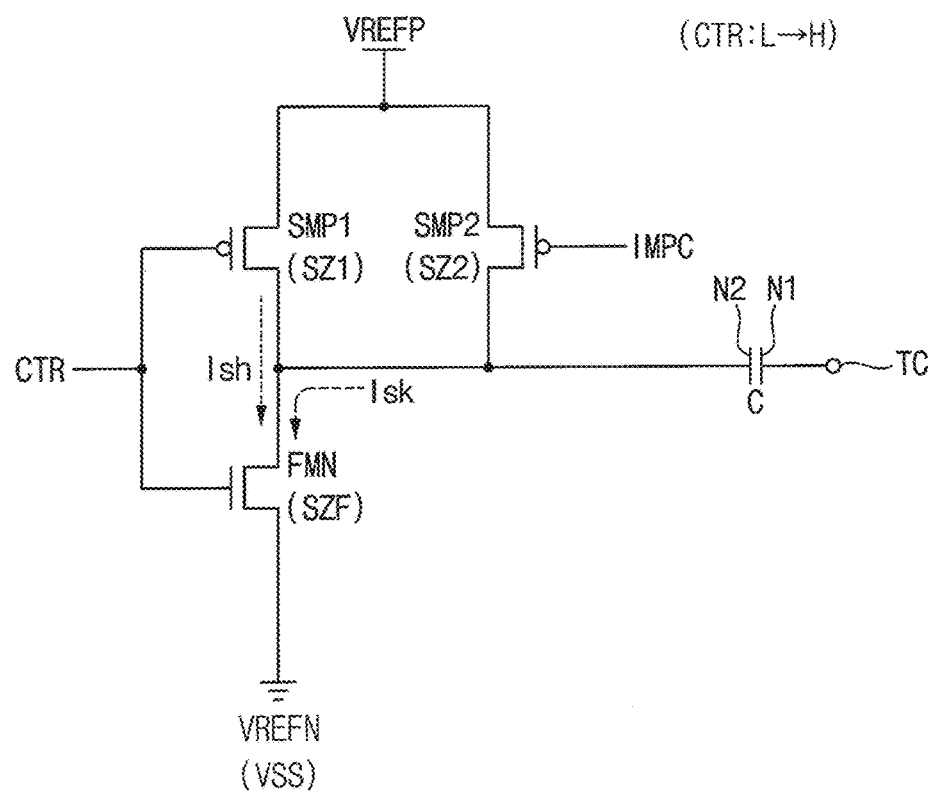

FIGS. 9 and 10 are diagrams illustrating short current reduction of the P-type split inverter of FIG. 7.

Referring to FIGS. 9 and 10, the control signal CTR may transition from the logic high level H to the logic low level L during time interval Tc~T3, for example, with a constant slew rate. According to transitioning of the control signal CTR, the first split PMOS transistor SMP1 that is reset to the turned-on state may be turned off and the full NMOS transistor FMN that is reset to the turned-off state may be turned on. Through such switching operation, the sinking current Isk may flow from the second capacitor node N2 to the second reference voltage VREFN and the voltage of the second capacitor node N2 may be pulled down from the first reference voltage VREFP to the second reference voltage VREFN. The second split PMOS transistor SMP2 may maintain the turned-off state corresponding to the reset state.

The full NMOS transistor FMN may start being turned on at time point T1 and the first split PMOS transistor SMP1 may be completely turned off at time point T2. In other words, both of the full NMOS transistor FMN and the first split PMOS transistor SMP1 may be turned on partially during time interval T1~T2, and thus a short current Ish flowing from the first reference voltage VREFP to the second reference voltage VREFN may be generated during time interval T1~T2.

As described above, the sum of the first size SZ1 of the first split PMOS transistor SMO1 and the second size SZ2 of the second split PMOS transistor SMP2 may be equal to the full size SZF of the full PMOS transistor FMP of the normal inverter NINV. For example, the division ratio of the first size SZ1 and the second size SZ2 may be 1:3, and in some example embodiments, the first size SZ1 becomes ¼ of the full size SZF. As such, the turn-of resistance of the first split PMOS transistor SMP1 may be increased by reducing the first size of the first split PMOS transistor SMP1, and thus the short current Ish flowing through the first split PMOS transistor SMP1 may be reduced.

As described with reference to FIGS. 2 through 10, the N-type split inverter NSINV and the P-type split inverter PSINV may reduce the short current Ish. The capacitor digital-to-analog converter 100 may reduce the short current without influence on the switching timing of the analog-to-digital converter using the N-type split inverter NSINV and/or the P-type split inverter PSINV. Therefore the power consumption of the analog-to-digital converter may be reduced and at the same time the operation speed of the analog-to-digital converter may be enhanced.

Hereinafter, a SAR type analog-to-digital converter using split inverters according to example embodiments are described but example embodiments are not limited to the SAR-type analog-to-digital converter. Example embodiments may be applied to any devices and systems to reduce power consumption with impedance matching.

Figure 11:
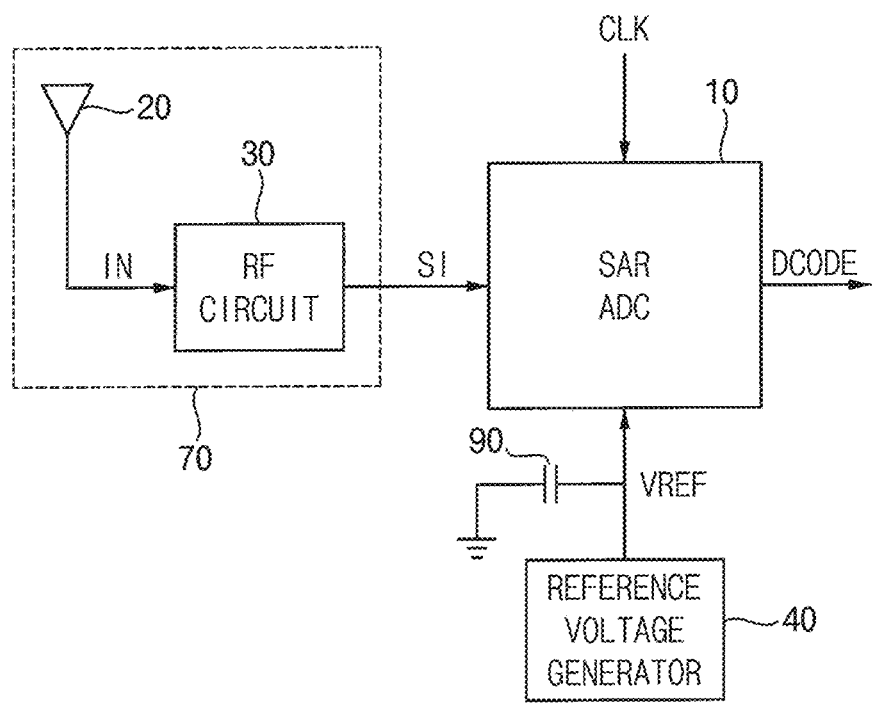
FIG. 11 is a block diagram illustrating a device including an analog-to-digital converter of successive approximation register (SAR) type according to example embodiments.

FIG. 11 is a block diagram illustrating a device including an analog-to-digital converter of successive approximation register (SAR) type according to example embodiments. An example embodiment of a communication device is illustrated in FIG. 11. Example embodiments are not limited to a communication device and may be applied any device and system including an analog-to-digital converter.

Referring to FIG. 11, the communication device may include an analog-to-digital converter (ADC) 10 of successive approximation register (SAT) type, a reference voltage generator 40 and/or an analog circuit 70. The analog circuit 70 may include an antenna 20 and a radio frequency (RF) circuit 30. In some example embodiments, the communication device may denote a reception terminal that receives various pieces of information. However, example embodiments are not limited thereto. In some example embodiments, the communication device may denote a transmission terminal that transmits various pieces of information, or a transceiver that performs both a reception function and a transmission function. Respective components included in the communication device may be implemented using hardware blocks, such as analog circuits and/or digital circuits, or software blocks such as instructions executed by a processor, etc.

The RF circuit 30 may receive an RF signal IN through the antenna 20 and may generate a baseband signal by performing down-conversion on the received RF signal IN. The baseband signal may be referred to as an analog input signal SI. In some example embodiments, the RF circuit 30 may generate the analog input signal SI by performing direct conversion so that the RF signal IN is directly converted into a baseband signal. In some example embodiments, the RF circuit 30 may convert the RF signal IN into an Intermediated Frequency (IF) signal and may generate the analog input signal SI by performing 2-step down conversion so that the IF signal is converted into the baseband signal.

The ADC 10 of the SAR type may receive the analog input signal SI and may convert the received analog input signal SI into a digital output signal or a digital code DCODE.

The reference voltage generator 40 may generate a reference voltage VREF and may provide the generated reference voltage VREF to the ADC 10. The reference voltage VREF may include the first reference voltage VREFP and the second reference voltage VREFN as described above.

The SAR-type ADC may require a decoupling capacitor 90 that is connected to an output terminal of the reference voltage generator 40 that requires very high power consumption to provide a peak current depending on a high frequency for a capacitor digital-to-analog converter included in the SAR-type ADC 10. The reference voltage generator 40 may consume power higher than the SAR-type ADC10. When a voltage generator of lower power is used to decrease band width, the decoupling capacitor 90 must have high capacitance to reduce voltage variation due to the peak current. For example, a decoupling capacitor higher than 1 nF is required for the 12-bit resolution of the digital code DCODE and the area of the decoupling capacitor may occupy about 50% of the entire area of the SAR-type ADC 10 and the reference voltage generator 40. The occupation area of the decoupling capacitor 90 is increased as the number of the analog-to-digital converters in a semiconductor chip increases.

According to example embodiments, the short current may be reduced using the split inverters, and thus a size of a device including the SAR-type ADC may be reduced by reducing the size of the decoupling capacitor for the reference voltage generator.

Figure 12:
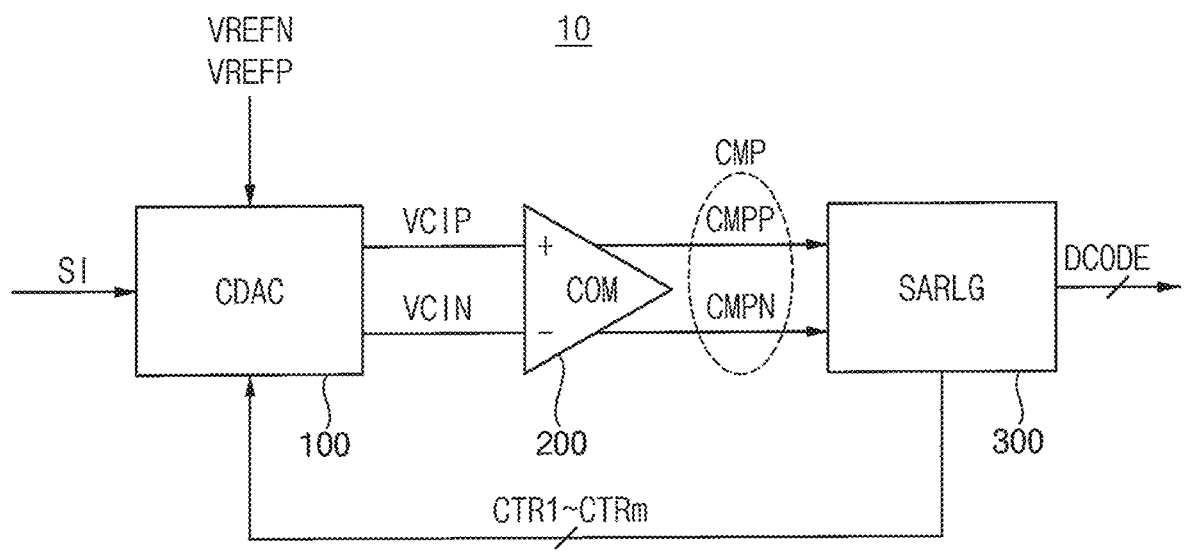
FIG. 12 is a block diagram illustrating an analog-to-digital converter of SAR type according to example embodiments.

FIG. 12 is a block diagram illustrating an analog-to-digital converter of SAR type according to example embodiments.

Referring to FIG. 12, an analog-to-digital converter 10 may be a SAR-type analog-to-digital converter that performs a binary search conversion to sequentially determine from a most significant bit to a least significant bit of a plurality of bits of a digital output signal corresponding to an analog input signal.

The analog-to-digital converter 10 may include a capacitor digital-to-analog converter (CDAC) 100, a comparator COM 200 and/or a SAR logic circuit SARLG 300.

The comparator 200 may generate a comparison signal by comparing comparison input voltages of comparison input terminals. For example, the comparison input terminals may include a positive input terminal (+) and a negative input terminal (−) and the comparison input voltages may include a positive comparison input voltage VCIP applied to the positive input terminal (+) and a negative comparison input voltage VCIN applied to the negative input terminal (−). The comparator 200 may compare the positive comparison input voltage VCIP and the negative comparison input voltage VIN to generate the comparison signal CMP. FIG. 12 illustrates an example that the comparator 200 output a differential signal pair CMPP and CMPN as the comparison signal CMP. In some example embodiments, the comparator 200 may output a single-ended signal corresponding to one of the signals CMPP and CMPN as the comparison signal CMP.

The SAR logic circuit 300 may generate a plurality of control signals CTR1~CTRm based on the comparison signal CMP to control the binary search conversion. The SAR logic circuit 300 may sequentially determine the logic levels of the plurality of control signals CTR1~CTRm one by one through the binary search conversion. After the binary search conversion is completed, the SAR logic circuit 300 may provide the digital output signal DCODE based on the determined logic levels of the plurality of control signals CTR1~CTRm. For example, the digital output signal DCODE may be a digital code including m bits. The plurality of control signals CTR1~CTRm may correspond to the m bits of the digital output signal DCODE, and the positive integer m may indicate the resolution of the analog-to-digital converter 10.

The CDAC 100 may include a plurality of drivers as described above with reference to FIG. 1. Each driver may control the comparison input voltages VCIP and VCIN based on the first reference voltage VREFP, the second reference voltage VREFN lower than the first reference voltage VREFP, the analog input signal SI and each of the plurality of control signals CTR1~CTRm. Each driver may include a capacitor and a split inverter. The first capacitor node of the capacitor may be connected to one of the comparison input terminals. The split inverter may include a pull-up unit connected to the first reference voltage VREFP and a pull-down unit connected to the second reference voltage VREFN as described above. The split inverter may drive a second capacitor node of the capacitor by selectively turning on one of the pull-up unit and the pull-down unit. A first one of the pull-up unit and the pull-down unit may include a full transistor, and a second one of the pull-up unit and the pull-down unit including a first split transistor and a second split transistor.

Figure 13:
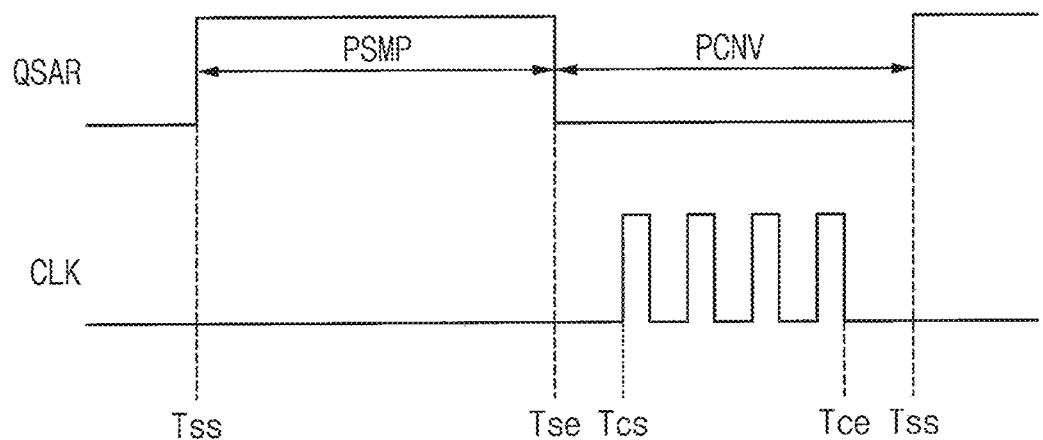
FIG. 13 is a diagram illustrating an overall operation of an analog-to-digital converter of SAR type according to example embodiments.

FIG. 13 is a diagram illustrating an overall operation of an analog-to-digital converter of SAR type according to example embodiments.

Referring to FIG. 13, a mode clock signal QSAR may indicate a sampling period PSMP or a conversion period PCNV. The mode clock signal QSAR may be an external signal applied to the analog-to-digital converter (e.g., the analog-to-digital converter 10 of FIG. 12). In some example embodiments, the mode clock signal QSAR may have a logic high level in the sampling period PSMP and a logic low level in the conversion period PCNV as illustrated in FIG. 13. In some example embodiments, the length of the sampling period PSMP may be different from the length of the conversion period PCNV. For example, the conversion period PCNV may be longer than the sampling period PSMP. According to example embodiments, the logic level of the mode clock signal QSAR may be defined conversely and/or the length of the sampling period PSMP may be equal to the length of the conversion period PCNV.

A clock signal CLK may be an internal clock signal generated within the analog-to-digital converter 10 based on the mode clock signal QSAR For example, the clock signal CLK may be generated by the comparator 200 in FIG. 12, but example embodiments are not limited thereto. For example, the clock signal CLK may include m clocks during the conversion period PCNV. FIG. 13 illustrates an example that m is four. The number m of the cycles may be varied according to the resolution of the analog-to-digital converter 10.

The sampling period PSMP corresponds to a first time interval Tss~Tse between a sampling start time point Tss and a sampling end time point Tse. The conversion period PCNV may be divided into a second time interval Tse~Tcs between the sampling end time point Tse and a conversion start time point Tcs, a third time interval Tcs~Tce between the conversion start time point Tcs and a conversion end time point Tce, and a fourth time interval Tce~Tss between the conversion end time point and the sampling start time point of the next cycle. Hereinafter, operations of the analog-to-digital converter 10 of FIG. 12 are described for the first through fourth time intervals.

In the first time interval Tss~Tse, input switches SWP and SWN as will be described below with reference to FIG. 16 may be turned on and the comparison input voltages VCIP and VCIN corresponding to the analog input signal SI may be sampled at the comparison input terminals.

In the second time interval Tse~Tcs, the input switches SWP and SWN may be turned off and the sampled comparison input voltage VCIP and VCIN corresponding to the analog input signal SI are maintained.

In the third time interval Tcs~Tce, the binary search conversion is performed to sequentially determine from a most significant bit to a least significant bit of a plurality of bits of the digital output signal DCODE corresponding to the analog input signal SI. Here, each driver of the plurality of drivers in the capacitor digital-to-analog converter 100 may selectively turn on one of the pull-up unit PU and the pull-down unit PD depending on the logic level of the corresponding control signal of the plurality of control signals CTR1~CTRm to drive the second capacitor node N2. Accordingly the voltage level of the control terminal TC connected to the first capacitor node N1 may be varied depending on the logic levels of the control signals CTR1~CTRm that are sequentially determined. The control terminal TC may correspond to one of the comparison input terminals and thus the comparison input voltages VCIP and VCIN may be varied depending on the logic levels of the control signals CTR1~CTRm.

In the fourth time interval Tce~Tss, the logic levels of the plurality of control signals CTR1~CTRm may be reset for conversion of next data included in the analog input signal SI. The reset logic levels of the plurality of control signals CTR1~CTRm may be determined depending on whether the split inverter included in the corresponding driver is the P-type split inverter PSINV or the N-type split inverter NSINV as described with reference to FIGS. 4 and 8.

Figure 14:
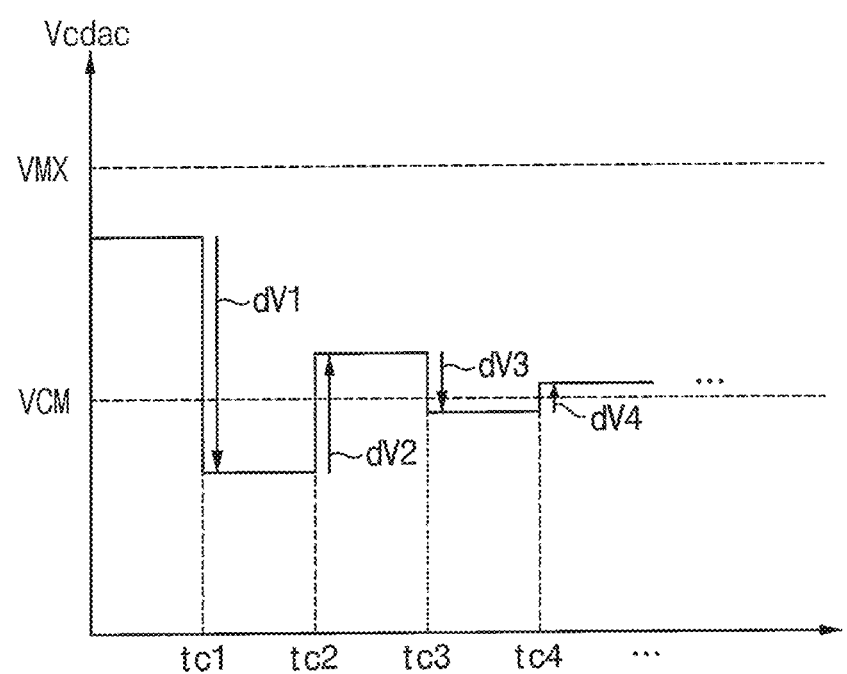
FIG. 14 is a diagram illustrating a binary search conversion of an analog-to-digital converter of SAR type according to example embodiments.
Figure 15:
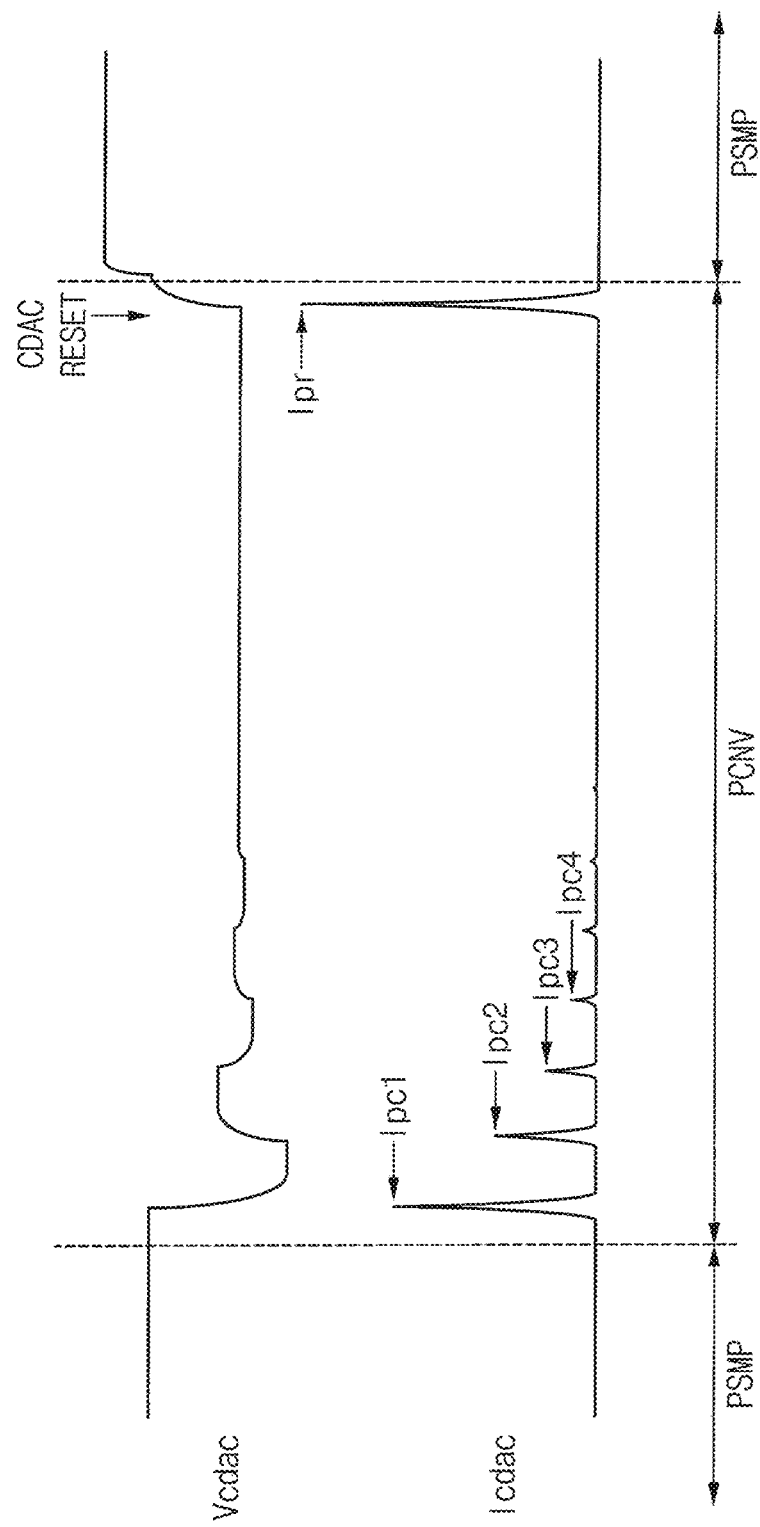
FIG. 15 is a diagram illustrating a voltage and a current of a capacitor digital-to-analog converter.

FIG. 14 is a diagram illustrating a binary search conversion of an analog-to-digital converter of SAR type according to example embodiments, and FIG. 15 is a diagram illustrating a voltage and a current of a capacitor digital-to-analog converter.

In FIG. 14, VMX indicates a maximum voltage of the analog input signal SI that can be converted by the analog-to-digital converter 10 and VCM indicate a common mode voltage. The common mode voltage may be a half of the maximum voltage VMX. The vertical axis indicate a voltage Vcdac of the capacitor digital-to-analog converter and the horizontal axis indicates an elapsed time. The voltage Vcdac corresponds to VCIP−VCIN+VCM, that is, a difference between the positive comparison input voltage VCIP and the negative comparison input voltage VCIN with respect to the common mode voltage VCM.

As an example, the binary search conversion is described referring to FIG. 14 for an example that the resolution of the digital output signal DCODE is four bits.

The SAR logic circuit 300 in FIG. 12 may sequentially determine the logic levels of the control signals CTR1~CTR4 at time points tc1~tc4 from the first control signal CTR1 corresponding to the most significant bit of the digital output signal DCODE to the fourth control signal CTR4 corresponding to the least significant bit of the digital output signal DCODE. The logic level of each control signal may be determined according to the relative magnitudes of the positive comparison input voltage VCIP and the negative comparison input voltage VCIN.

When the positive comparison input voltage VCIP is higher than the negative comparison input voltage VCIN, that is, when the voltage Vcdac is higher than the common mode voltage VCM, the logic level of the corresponding control signal may be determined to decrease the voltage Vcdac. For example, the voltage Vcdac may be decreased by an amount dV1 at time point tc1 and by an amount dV3 at time point tc3 as illustrated in FIG. 14.

In contrast, when the positive comparison input voltage VCIP is lower than the negative comparison input voltage VCIN, that is, when the voltage Vcdac is lower than the common mode voltage VCM, the logic level of the corresponding control signal may be determined to increase the voltage Vcdac. For example, the voltage Vcdac may be increased by an amount dV2 at time point tc2 and by an amount dV4 at time point tc4 as illustrated in FIG. 14.

Here, the first through fourth drivers corresponding the first through fourth control signals CTR1~CTR4 may include capacitors having sizes that are sequentially decreased by a half such that the changing amounts dV1~dV4 of the voltage Vcdac may be sequentially decreased by a half. In other words, the changing amounts dV1~dV4 may satisfy the relationships as dV1=2*dV2=4*dV3=8*dV4. Through such binary search conversion, the logic levels of the first through fourth control signals CTR1~CTR4 may be determined sequentially such the voltage Vcdac may approach the common mode voltage VCM.

FIG. 15 illustrates the voltage Vcdac and the current Icdac of the capacitor digital-to-analog converter in the sampling period PSMP and the conversion period PCNV. The current Icdac may include switching peak currents Ipc1~Ipc4 due to the switching operations of the split inverters respectively included in the first through fourth drivers and a reset peak current due to the reset operation of the first through fourth control signals CTR1~CTR4.

To secure desired performance of the analog-to-digital converter 10, the variation of the first reference voltage VREFP when the second reference voltage VREFN corresponds to the ground voltage VSS must be less than the voltage changing amount (e.g., dV4 in FIG. 14) corresponding to the least significant bit. The variation of the first reference voltage VREFP may be determined depending on the ratio of the current Icdac and the capacitance of the decoupling capacitor 90 in FIG. 11. Accordingly the switching peak current Ipc1~Ipc4 have be reduced to reduce the size of the decoupling capacitor 90.

The switching peak currents Ipc1~Ipc4 may be reduced by reducing short currents using the split inverters according to example embodiments. In comparison with the normal inverters, the peak currents may be reduced by about 40% when the ratio of the first size SZ1 and the second size SZ3 is 1:3 for the above described split inverter. Accordingly the size of the decoupling capacitor 90 may be reduced significantly and the size of the device including the analog-to-digital converter may be reduced.

Figure 16:
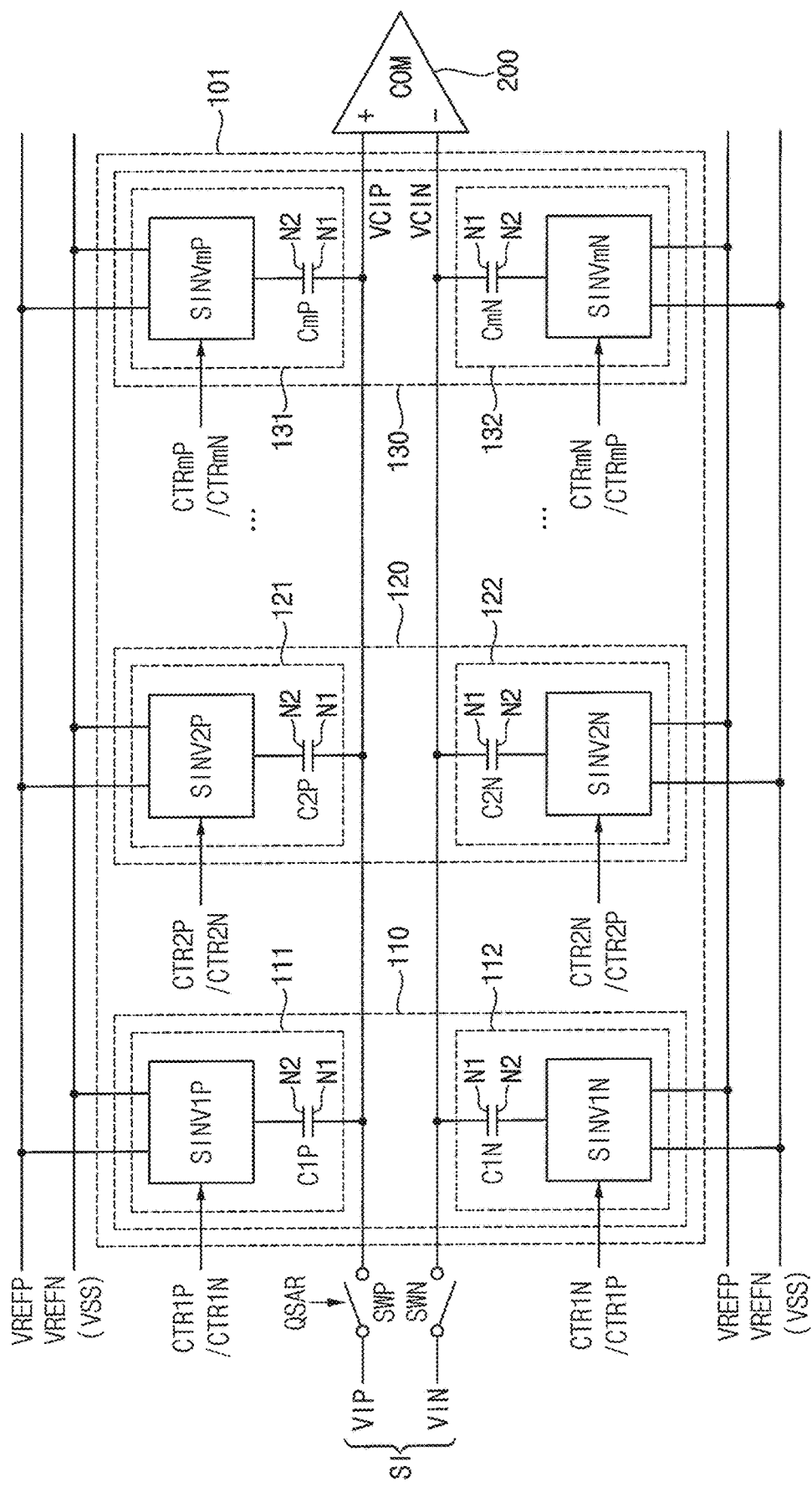
FIG. 16 is a diagram illustrating a capacitor digital-to-analog converter according to example embodiments.

FIG. 16 is a diagram illustrating a capacitor digital-to-analog converter according to example embodiments. Also the comparator COM 200 as described above is illustrated in FIG. 16, Referring to FIG. 16, a capacitor digital-to-analog converter 101 may include a plurality of drivers 111, 112, 121, 122, 131 and 132 that respectively include a plurality of split inverters SINV1P, SINV1N, SINV2P, SINV2N, SINVmP and SINVmN and a plurality of capacitors C1P, C1N, C2P, C2N, CmP and CmN.

The plurality of drivers 111, 112, 121, 122, 131 and 132 may be grouped into a plurality of driver pairs 110, 120 and 130 corresponding to each bit of the digital output signal DCODE as described above. Each driver pair of the driver pairs 110, 120 and 130 may include each of the positive drivers 111, 121 and 131 and each of the negative drivers 112, 122 and 132. The positive drivers 111, 121 and 131 may include the positive split inverters SINV1P, SINV2P and SINVmP, respectively, and the negative drivers 112, 122 and 132 may include the negative split inverters SINV1N, SINV2N and SINVmN, respectively The positive split inverter SINV1P in the first positive driver 111 of the first driver pair 110 may perform a switching operation based on a first positive control signal CTR1P and an inversion signal /CTR1N of a first negative control signal CTR1N to drive the second capacitor node N2 of a first positive capacitor C1P. The negative split inverter SINV1N in the first negative driver 112 of the first driver pair 110 may perform a switching operation based on the first negative control signal CTR1N and an inversion signal /CTR1P of the first positive control signal CTR1P to drive the second capacitor node N2 of a first negative capacitor C1N. The first positive control signal CTR1P and the first negative control signal CTR1N correspond to the first control signal CTR1 corresponding to the most significant bit, that is, a first bit of the digital output signal DCODE. As will be described below with reference to FIGS. 17 and 18, the inversion signals /CTR1P and /CTR1N correspond to the impedance control signal IMPC as described above.

The positive split inverter SINV2P in the second positive driver 121 of the second driver pair 120 may perform a switching operation based on a second positive control signal CTR2P and an inversion signal /CTR2N of a second negative control signal CTR2N to drive the second capacitor node N2 of a second positive capacitor C2P. The negative split inverter SINV2N in the second negative driver 122 of the second driver pair 120 may perform a switching operation based on the second negative control signal CTR2N and an inversion signal /CTR2P of the second positive control signal CTR2P to drive the second capacitor node N2 of a second negative capacitor C2N. The second positive control signal CTR2P and the second negative control signal CTR2N correspond to the second control signal CTR2 corresponding to a second bit of the digital output signal DCODE. As will be described below with reference to FIGS. 17 and 18, the inversion signals /CTR2P and /CTR2N correspond to the impedance control signal IMPC as described above.

The positive split inverter SINVmP in the m-th positive driver 131 of the m-th driver pair 130 may perform a switching operation based on an m-th positive control signal CTRmP and an inversion signal /CTRmN of an m-th negative control signal CTRmN to drive the second capacitor node N2 of an m-th positive capacitor CmP. The negative split inverter SINVmN in the m-th negative driver 132 of the m-th driver pair 130 may perform a switching operation based on the m-th negative control signal CTRmN and an inversion signal /CTRmP of the m-th positive control signal CTRmP to drive the second capacitor node N2 of an m-th negative capacitor CmN. The m-th positive control signal CTRmP and the m-th negative control signal CTRmN correspond to the m-th control signal CTRm corresponding to a least significant bit, that is, an m-th bit of the digital output signal DCODE. As will be described below with reference to FIGS. 17 and 18, the inversion signals /CTRmP and /CTRmN correspond to the impedance control signal IMPC as described above.

To perform the binary search conversion as described with reference to FIG. 14, the capacitance of the capacitors C2P and C2N in the second driver pair 120 may be ½ of the capacitance of the capacitors C1P and C1N in the first driver pair 110. In this way, the capacitance of the capacitors CmP and CmN in the m-th driver pair 130 may be $½^{m-1}$ of the capacitance of the capacitors C1P and C1N in the first driver pair 110.

An analog-to-digital converter according to example embodiments may further include at least one input switch configured to be turned on to apply the analog input signal SI to at least one of the comparison input terminals during the sampling period PSMP and configured to be turned off during the conversion period PCNV while the binary search conversion is performed.

In some example embodiments, as illustrated in FIG. 16, the analog input signal SI may be a differential signal including a positive input signal VIP and a negative input signal YIN. In some example embodiments, the analog-to-digital converter may include a positive input switch SWP and a negative input switch SWN, which are turned on based on the mode clock signal QSAR.

The positive input switch SWP may be turned on to apply the positive input signal VIP to the positive input terminal (+) of the comparator 200 during the sampling period PSMP and may be turned off during the conversion period PCNV while the binary search conversion is performed. The negative input switch SWN may be turned on to apply the negative input signal VIN to the negative input terminal (−) of the comparator 200 during the sampling period PSMP and may be turned off during the conversion period PCNV.

Figure 17:
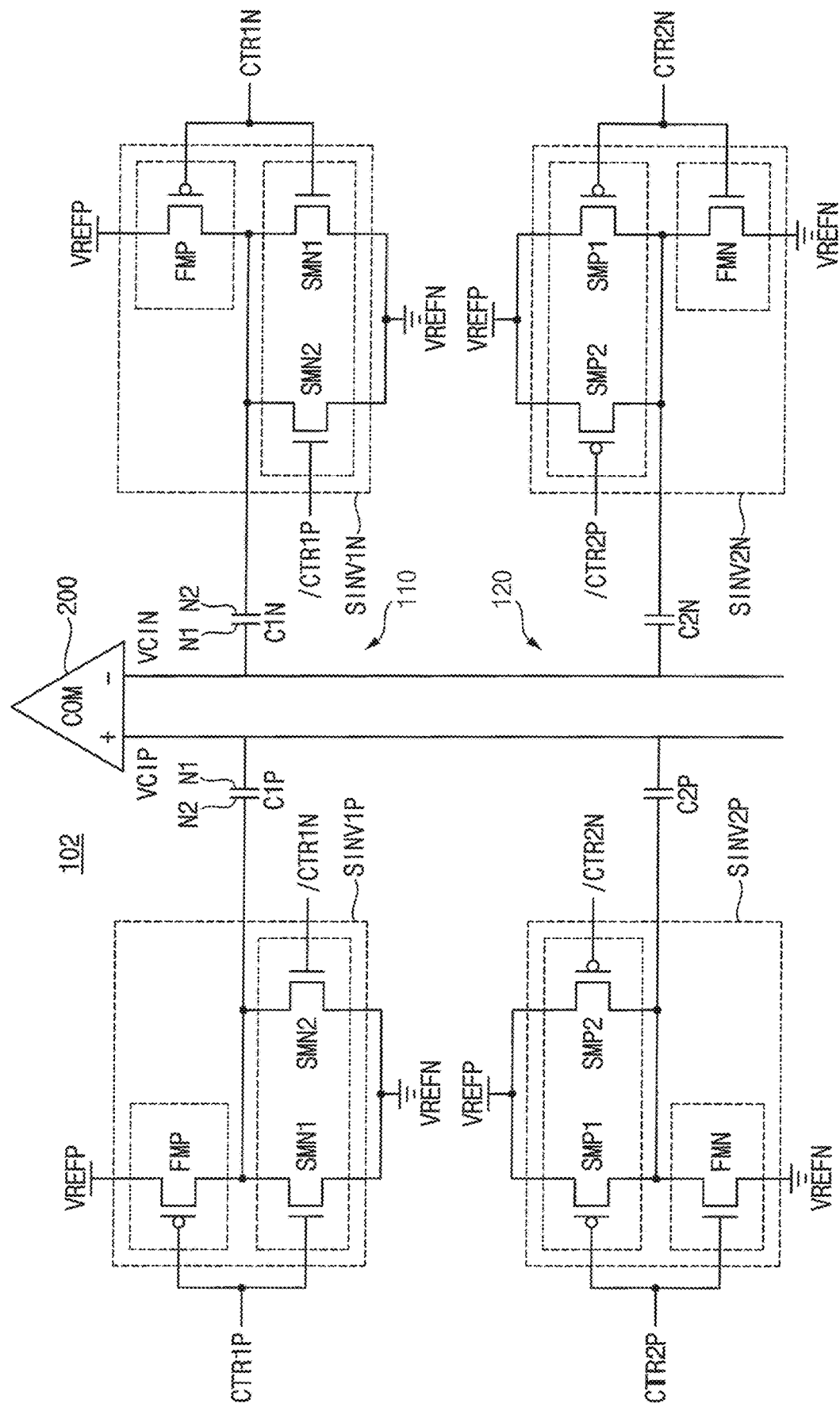
FIG. 17 is a circuit diagram illustrating a capacitor digital-to-analog converter according to example embodiments.
Figure 18:
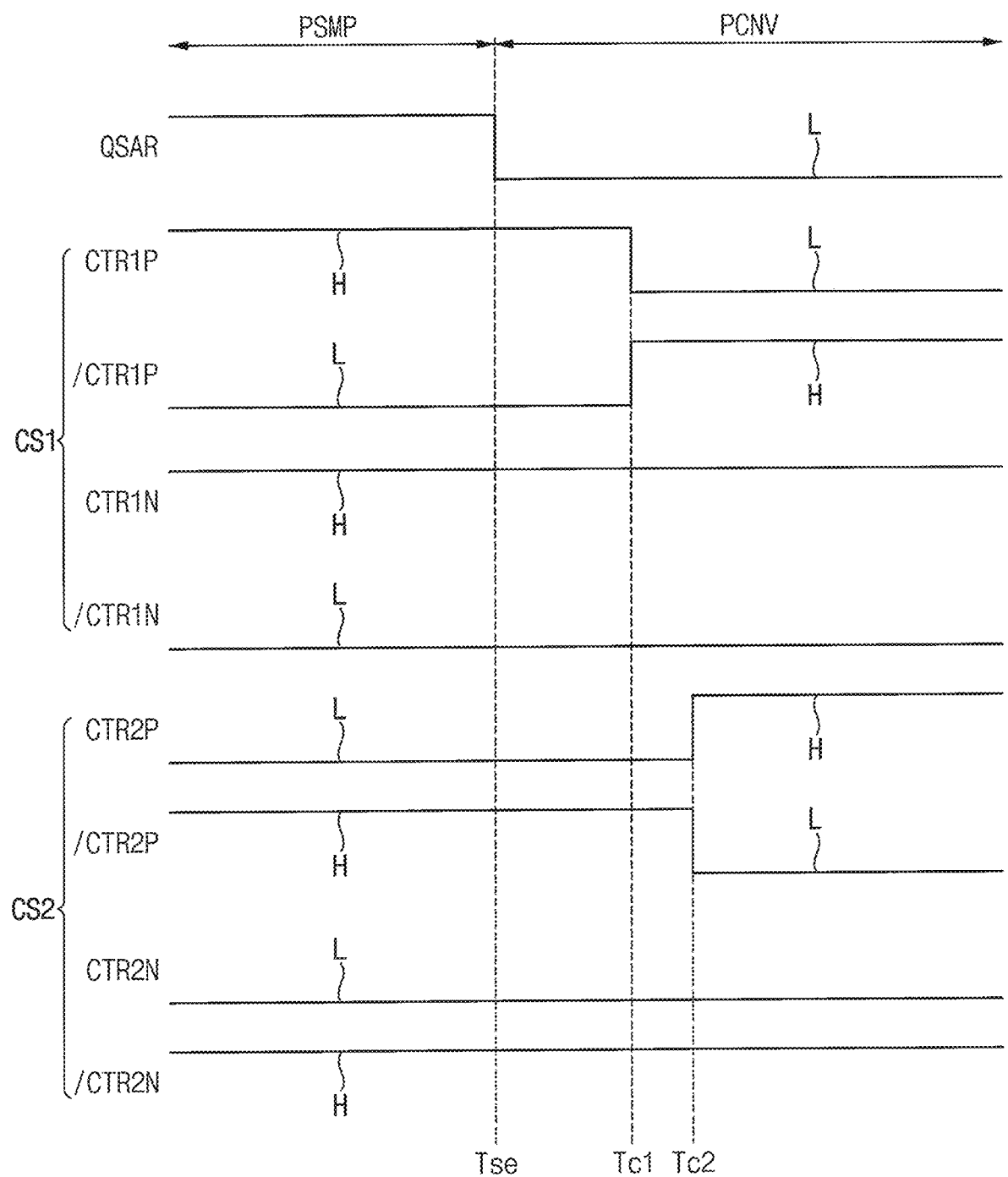
FIG. 18 is a timing diagram illustrating an operation of the capacitor digital-to-analog converter of FIG. 17.

FIG. 17 is a circuit diagram illustrating a capacitor digital-to-analog converter according to example embodiments, and FIG. 18 is a timing diagram illustrating an operation of the capacitor digital-to-analog converter of FIG. 17. Only the first driver 110 and the second driver pair 120 are illustrated in FIG. 17 for convenience of illustration and description.

Referring to FIG. 17, both of the positive split inverter and the negative split inverter included in the same driver pair may be implemented with the N-type split inverters as described with reference to FIG. 3 or the P-type split inverters as described with reference to FIG. 7. In an example of FIG. 17, the first positive split inverter SINV1P and the first negative split inverter SINV1N in the first driver pair 110 are implemented with the N-type split inverters and the second positive split inverter SINV2P and the second negative split inverter SINV2N in the second driver pair 120 are implemented with the P-type split inverters. Example embodiments are not limited to the configuration of FIG. 17, and the plurality of driver pairs of various combinations of the N-type split inverters and the P-type split inverters. In some example embodiments, all of the plurality of drivers may be implemented with the N-type split inverters or all of the plurality of drivers may be implemented with the P-type split inverters.

As illustrated in FIG. 17, the control signals CTR1P, CTR2P, CTR2P and CTR2N may be applied to the gate electrodes of the full transistors FMP and FMN and the first split transistors SMN1 and SMP1, respectively, and the inversion signals /CTR1P, /CTR2P, /CTR2P and /CTR2N corresponding to the impedance control signals IMPC may be applied to the gate electrodes of the second split transistors SMN2 and SMP2, respectively.

Accordingly the full transistors FMP and FMN and the first split transistors SMN1 and SMP1 included in the first and second positive split inverters SINV1P and SINV2P may be turned on complementarily based on the first and second positive control signals CTR1P and CTR2P, respectively, and the full transistors FMP and FMN and the first split transistors SMN1 and SMP1 included in the first and second negative split inverters SINV1N and SINV2N may be turned on complementarily based on the first and second negative control signals CTR1N and CTR2N, respectively, In addition, the second split transistors SMN2 and SMP2 included in the first and second positive split inverters SINV1P and SINV2P may be turned on based on the inversion signals /CTR1N and /CTR2N of the first and second negative control signals CTR1N and CTR2N, respectively, and the second split transistors SMN2 and SMP2 included in the first and second negative split inverters SINV1N and SINV2N may be turned on based on inversion signals /CTR1P and /CTR2P of the first and second positive control signals CTR1P and CTR2P, respectively, FIG. 18 illustrates an example of the logic levels of the first positive control signal CTR1P, the first negative control signal CTR1N, the second positive control signal CTR2P, the second negative control signal CTR2N and the inversion signals (/CTR1P, /CTR1N, /CTR2P, /CTR2N), which are generated from the SAR logic circuit 300 in FIG. 12, during the sampling period PSMP and the conversion period PCNV. For example, through the binary search conversion as described above, the first bit (the most significant bit) of the digital output signal DCODE may be determined as '0' at a first conversion time point tc1, and the second bit of the digital output signal DCODE may be determined as '1' at a second conversion time point tc1.

Referring to FIGS. 17 and 18, at the beginning of or before the sampling period PSMP, the SAR logic circuit 300 may reset the first positive control signal CTR1P and the first negative control signal CTR1N corresponding to the N-type split inverters SINV1P and SINV1N to the logic high level H and reset the second positive control signal CTR2P and the second negative control signal CTR2N corresponding to the P-type split inverters SINV2P and SINV2N to the logic low level L.

As such, the SAR logic circuit 300 may reset the positive control signals CTR1P and CTR2P and the negative control signals CTR1N and CTR2N such that the full transistors FMP and FMN and the second split transistors SMN2 and SMP2 may be turned off and the first split transistors SMN1 and SMP1 may be turned on.

For example, at the first conversion time point Tc1, the SAR logic circuit 300 may transition the first positive control signal CTR1P from the reset logic high level H to the logic low level L and may maintain the reset logic high level H of the first negative control signal CTR1N.

At the first conversion time point Tc1, with respect to the first positive split inverter SINV1P, the full PMOS transistor FMP is turned on, the first split NMOS transistor SMN1 is turned off and the second split NMOS transistor SMN2 maintain the turn-off state corresponding to the reset state. Thus the first positive split inverter SINV1P may pull up the positive comparison input voltage VCIP at the positive input terminal (+) by driving the second capacitor node N2 of the first positive capacitor C1P with the first reference voltage VREFP.

At the first conversion time point Tc1, with respect to the first negative split inverter SINV1N, the full PMOS transistor FMP maintains the turned-off state corresponding to the reset state, the first split NMOS transistor SMN1 maintains the turned-on state corresponding to the reset state and the second split NMOS transistor SMN2 is turned on based on the inversion signal /CTR1P. The impedance of the first negative split inverter SINV1N may be matched to the impedance of the first positive split inverter SINV1P by turning on the second split NMOS transistor SMN2.

For example, at the second conversion time point Tc2, the SAR logic circuit 300 may transition the second positive control signal CTR2P from the reset logic low level L to the logic high level H and may maintain the reset logic low level L of the second negative control signal CTR2N.

At the second conversion time point Tc2, with respect to the second positive split inverter SINV2P, the full NMOS transistor FMN is turned on, the first split PMOS transistor SMP1 is turned off and the second split PMOS transistor SMP2 maintain the turn-off state corresponding to the reset state. Thus the second positive split inverter SINV2P may pull down the positive comparison input voltage VCIP at the positive input terminal (+) by driving the second capacitor node N2 of the second positive capacitor C2P with the second reference voltage VREFN.

At the second conversion time point Tc2, with respect to the second negative split inverter SINV2N, the full NMOS transistor FMN maintains the turned-off state corresponding to the reset state, the first split PMOS transistor SMP1 maintains the turned-on state corresponding to the reset state and the second split PMOS transistor SMP2 is turned on based on the inversion signal /CTR2P. The impedance of the second negative split inverter SINV2N may be matched to the impedance of the second positive split inverter SINV2P by turning on the second split PMOS transistor SMP2.

As such, the SAR logic circuit 300 may reset the positive control signal and the negative control signal to the same logic level before the binary search conversion and may transition selectively one of the positive control signal and the negative control signal by the binary search conversion, that is, the result of each bit conversion.

When the corresponding control signal is transitioned, the short current may be reduced because the size of the switched split transistor is small and thus the output node of the split inverter may be pulled up or pulled down rapidly due to the reduction of the short current. Accordingly devices and systems using the split inverters may have reduced power consumption and enhanced operation speed.

In addition, when the corresponding control signal is not transitioned, the second split transistor is turned on additionally while the first split transistor maintains the turned-on state, and thus impedance matching may be realized. Because the voltage variation does not occur when the corresponding control signal is not transitioned, the speed of the impedance matching is not important and thus the timing margin of the split inverter may be increased.

In conventional schemes using non-overlap pulses to reduce the short current, the operation timing is very critical and thus a delay circuit is required. Those schemes may affect the operation speed of the analog-to-digital converter. In particular, the SAR-type analog-to-digital converter repeats the same bit conversion for multiple bits and thus the operation speed may be further reduced.

According to example embodiments, the inversion signals as described above may be used the impedance control signal IMPC though simple routing without the delay circuit. Accordingly the penalty of the occupation area in addition to the power consumption may be reduced or minimized in implementing example embodiments.

Figure 19:
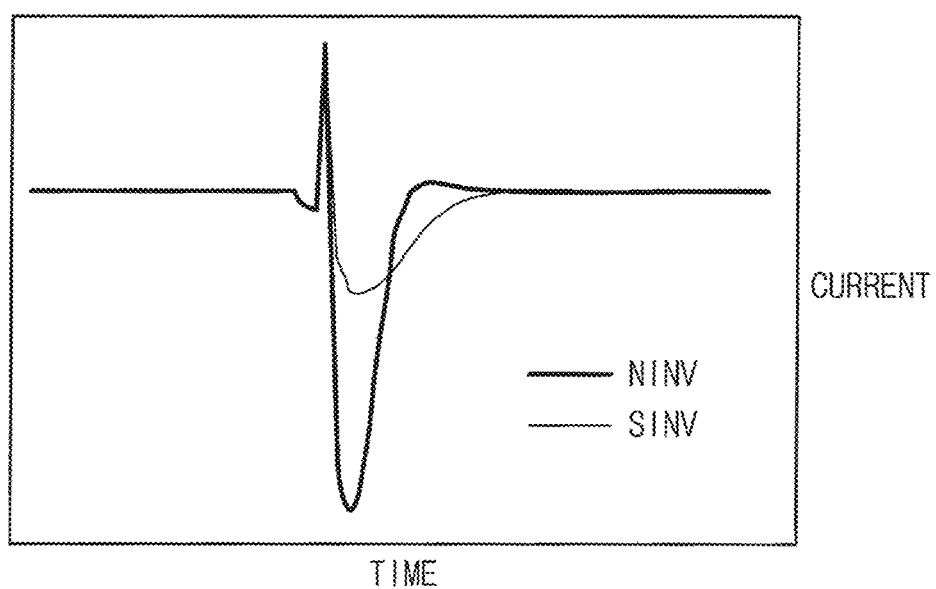
Figure 20:
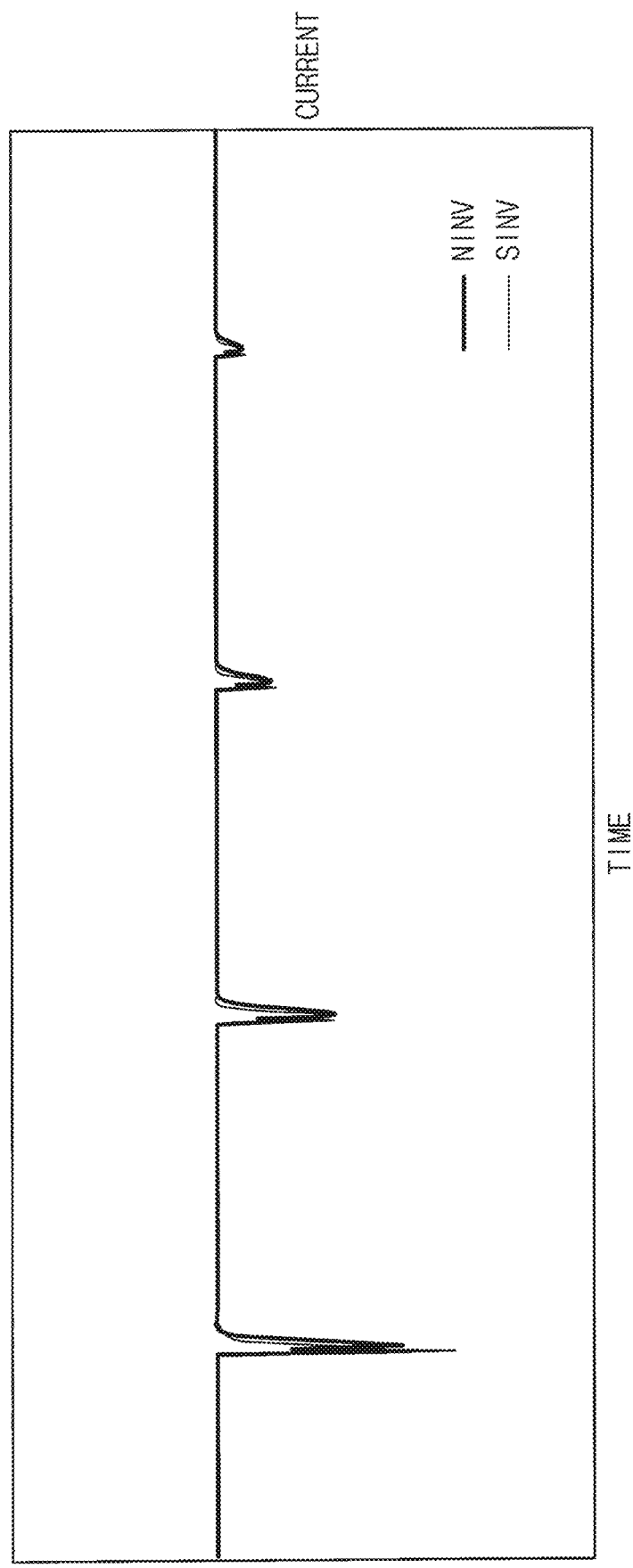

FIGS. 19, 20 and 21 are diagram illustrating effects of an analog-to-digital converter of SAR type according to example embodiments.

FIGS. 19, 20 and 21 illustrate the result of switching energy simulation with respect to 12-bit analog-to-digital converter corresponding to a particular manufacturing process. FIG. 19 shows a current in the reset operation and FIG. 20 shows a current during the conversion operation.

In FIGS. 19 and 20, the graphs of the bold lines indicate the case of using the conventional normal inverter NINV and the graphs of the fine lines indicate the case of using the split inverter SINV according to example embodiments. FIG. 21 shows relative values of the analog-to-digital converter using the split inverter SINV when the values of the analog-to-digital converter using the normal inverter NINV are normalized to one. FIG. 21 illustrates the comparison items of the average current for the entire operation, the reset current, the peak currents for the four most significant bits.

Using the split inverters, the average current has been reduced by about 40%, the reset current has been reduced by about 45%, and the other SAR switching current has been reduced by about 20%.

Figure 22:
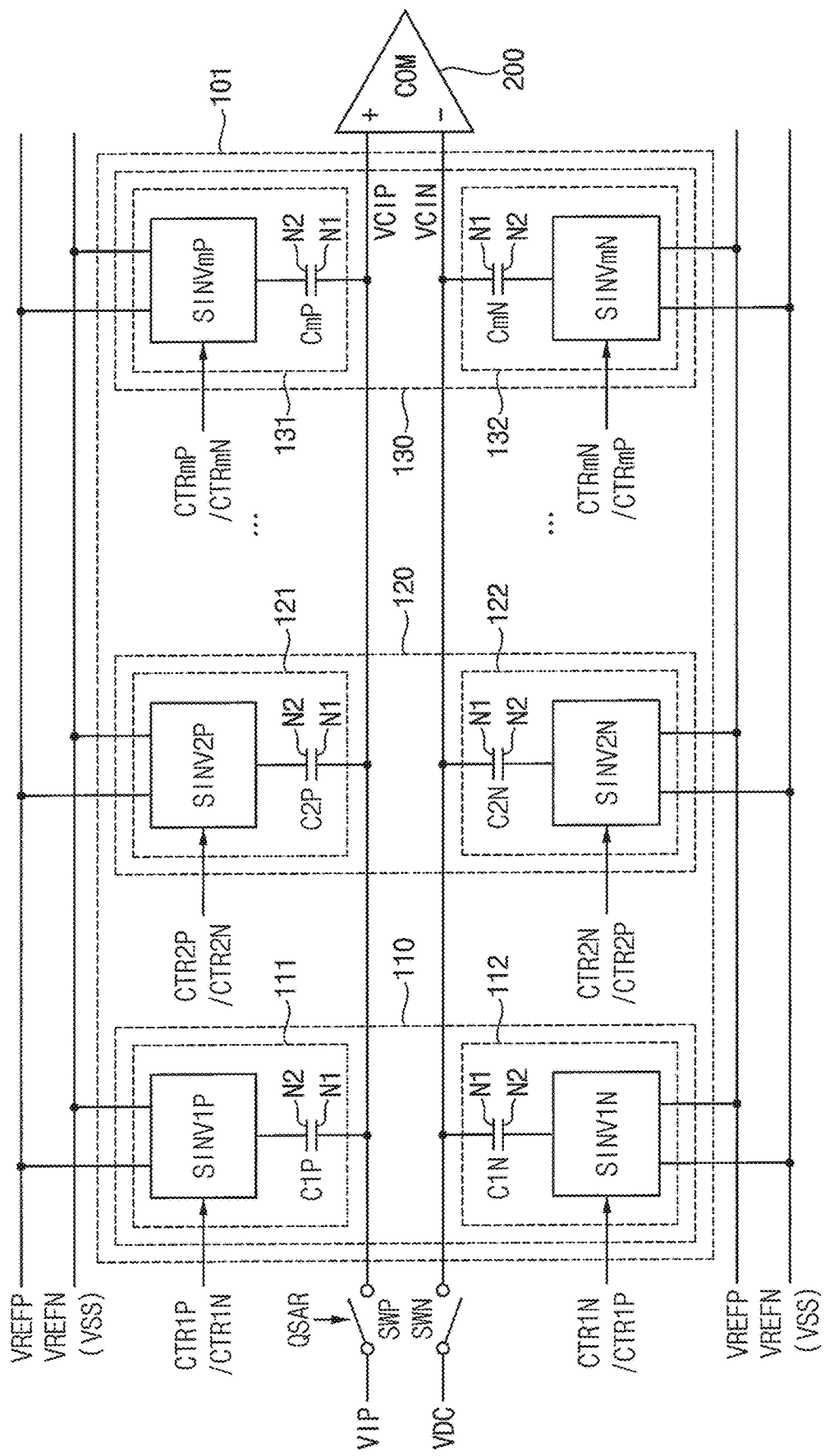
FIG. 22 is a diagram illustrating a capacitor digital-to-analog converter according to example embodiments.

FIG. 22 is a diagram illustrating a capacitor digital-to-analog converter according to example embodiments. A capacitor digital-to-analog converter of FIG. 22 is the same or substantially the same as the digital-to-analog converter of FIG. 1, and the repeated descriptions are omitted.

Referring to FIG. 22, the analog input signal SI as described above may be a single-ended signal VIP, In some example embodiments, the analog-to-digital converter may further include a positive input switch SWP and a negative input switch SWN, which are turned on based on the mode clock signal QSAR.

The positive input switch SWP may be turned on to apply the single-ended signal VIP to the positive input terminal (+) of the comparator 200 during the sampling period PSMP and may be turned off during the conversion period PCNV while the binary search conversion is performed. The negative input switch SWN may be turned on to apply a voltage VDC having a constant voltage level to the negative input terminal (−) of the comparator 200 during the sampling period PSMP and may be turned off during the conversion period PCNV.

Figure 23:
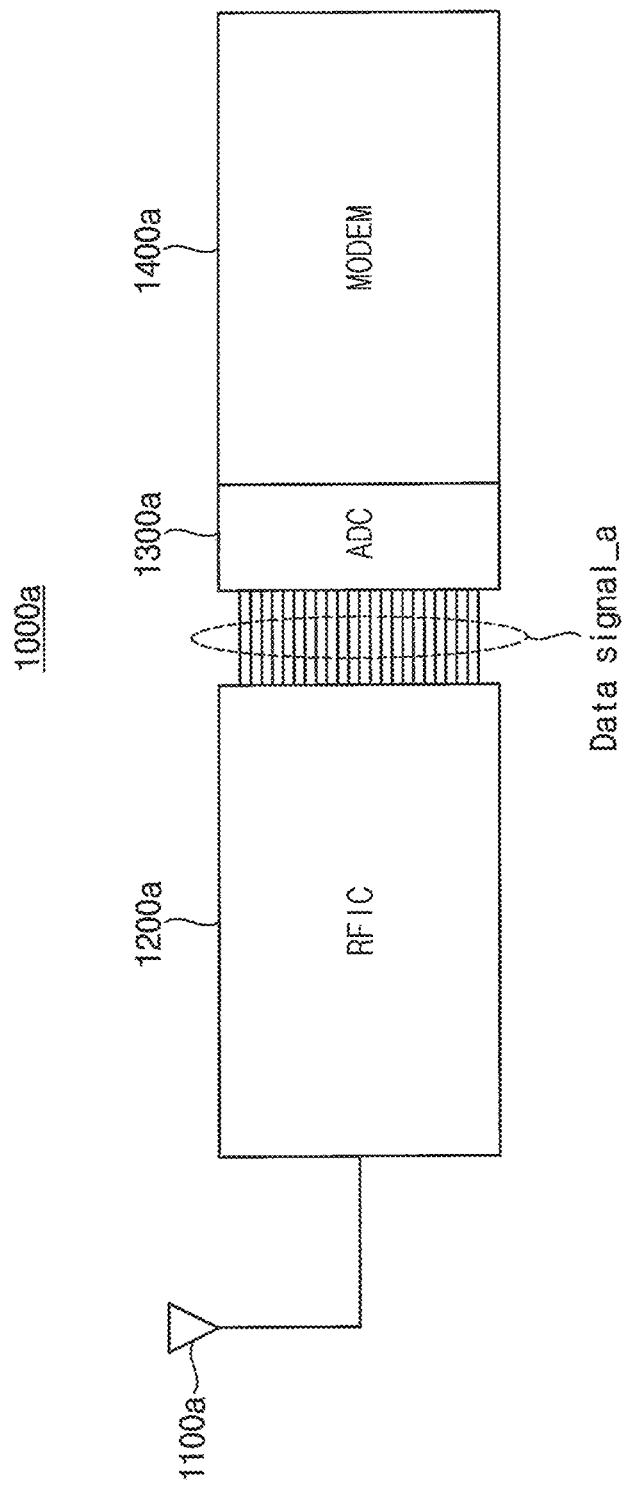
FIGS. 23 and 24 are block diagrams illustrating a communication device according to example embodiments.
Figure 24:
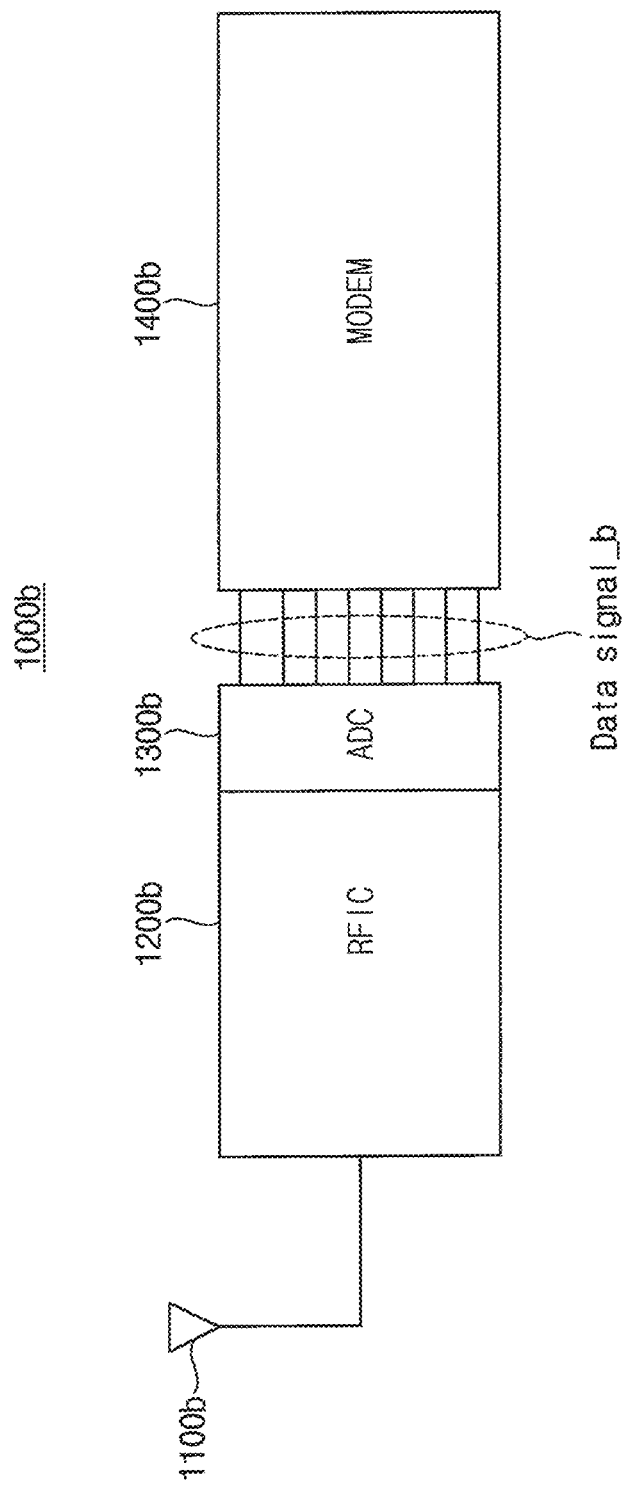

FIGS. 23 and 24 are block diagrams illustrating a communication device according to example embodiments.

Referring to FIG. 23, a communication device 1000a may include an antenna 1100a, a radio frequency integrated circuit (RFIC) 1200a, an ADC 1300a, and/or a modem 1400a. The RFIC 1200a may receive a wireless signal via the antenna 1100a and may decrease a frequency of the wireless signal to a baseband, thereby providing an analog data signal DATA signal_a to the ADC 1300a. The ADC 1300a may convert the analog data signal DATA signal_a into a digital data signal, and the modem 1400a may convert the digital data signal into a data signal that may be processed by an application processor (AP). In some example embodiments, the ADC 1300a and the modem 1400a may be embodied as a single chip. The ADC 1300a may include at least one SAR-type analog-to-digital converter including split inverter according to example embodiments. Therefore, the single chip according to the present example embodiments may be applied to a modem chip.

Referring to FIG. 24, unlike the example embodiments of FIG. 13, an RFIC 1200b and an ADC 1300b of a communication device 1000b may be embodied as a single chip. The single chip including the RFIC 1200b and the ADC 1300b may transmit a digital input signal DATA signal_b to a modem 1400b. The modem 1400b may convert the digital input signal DATA signal_b into a data signal that may be processed by the AP. The single chip including the RFIC 1200b and the ADC 1300b may be connected to the modem 1400b via multiple digital signal lines. The ADC 1300b may include at least one SAR-type analog-to-digital converter including split inverter according to example embodiments. Therefore, the single chip according to example embodiments may be applied to an RF chip.

Figure 25:
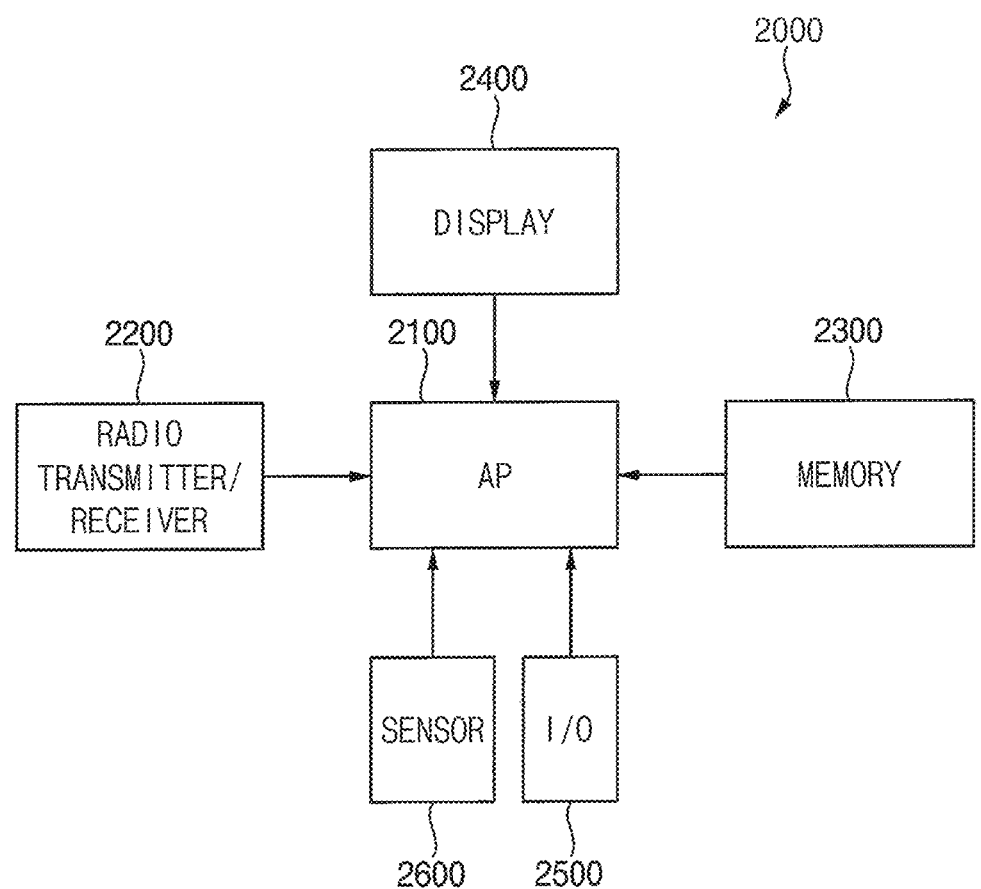
FIG. 25 is a block diagram illustrating an internet of things (IoT) device according to example embodiments.

FIG. 25 is a block diagram illustrating an internet of things (IoT) device according to example embodiments.

Referring to FIG. 25, an ADC according to example embodiments as described above may be included in an Internet of Things (IoT) device 2000. IoT may denote a system of internetworking products using wired/wireless communication. An IoT device may have an accessible wired or wireless interface and may exchange data with at least one device via the wired or wireless interface. The accessible wired or wireless interface may include a Local Area Network (LAN), a Wireless Local Area Network (WLAN) such as Wi-Fi, a Wireless Personal Area Network (WPAN) such as Bluetooth, a Wireless Universal Serial Bus (USB), Zigbee, Near Field Communication (NFC), Radio-frequency Identification (RFID), Power Line Communication (PLC), a modem communication interface, e.g., third generation (3G), fourth generation (4G), or Long Term Evolution (LTE), which may access a mobile cellular network. The Bluetooth interface may support Bluetooth Low Energy (BLE).

In particular, the IoT device 2000 may include a communication interface 2200 to communicate with an external device. The communication interface 2200 may be, for example, a wireless short-range communication interface such as a LAN, Bluetooth, Wi-Fi, or Zigbee, or a modem communication interface, e.g., PLC, 3G, or LTE, which may accesses a mobile communication network. The communication interface 2200 may include a transmitter, a receiver or a transceiver (transmitter and receiver). The IoT device 2000 may transmit information to and/or receive information from an access point or a gateway through the communication interface. Also, the IoT device 2000 may transmit and/or receive control information or data of the IoT device 2000 by communicating with a user device or another IoT device.

In some example embodiments, the receiver of the communication interface 2200 may include an ADC, and the ADC may be embodied according to the descriptions provided with reference to FIGS. 1 to 18. In particular, the receiver of the communication interface 2200 may include a SAR-type ADC, and the SAR-type ADC may include the split inverters capable of the short current.

The IoT device 2000 may include a processor, such as an AP 2100, for executing an arithmetic operation. The IoT device 2000 may further include a power supply, such as a battery or an external power supply which receives power from an outside source. Also, the IoT device 2000 may include a display 2400 for displaying data, such as an internal state of the IoT device 2000. The user may control the IoT device 2000 via a user interface (UI) of the display 2400. The IoT device 2000 may transmit the internal state and/or data through the transmitter and may receive a control instruction and/or data from the outside through the receiver.

A memory 2300 may store a control instruction code for controlling the IoT device 2000, control data, or user data. The memory 2300 may include at least one of a volatile memory and a non-volatile memory. The non-volatile memory may include at least one of Read Only Memory (ROM), Programmable ROM (PROM), Electrically Programmable ROM (EPROM), Electrically Erasable and Programmable ROM (EEPROM), flash memory, Phase-change random access memory (PRAM), Magnetic RAM (MRAM), Resistive RAM (ReRAM), and Ferroelectric RAM (FRAM). The volatile memory may include at least one of Dynamic RAM (DRAM), Static RAM (SRAM), and Synchronous DRAM (SDRAM).

The IoT device 2000 may further include a storage device. The storage device may be a non-volatile medium such as hard disk drive (HDD), Solid State Disk (SSD), an embedded Multi Media Card (eMMC), or Universal Flash Storage (UFS). The storage device may store user information provided via an input/output device 2500 and sensing information collected through a sensor 2600.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As described above, the split inverter according to example embodiments may reduce a short current by dividing one of the pull-up unit and the pull-down unit into at least two split transistors and controlling the switching timings of the split transistors.

The capacitor digital-to-analog converter and the analog-to-digital converter of the SAR type according to example embodiments may reduce power consumption by reducing the short current using the split inverter. The operation speed of devices such as the analog-to-digital converter including the capacitor digital-to-analog converter may be enhanced without influence on the switching timings of the analog-to-digital converter.

In addition, the capacitor digital-to-analog converter and the analog-to-digital converter according to example embodiments may reduce size of devices including the analog-to-digital converter by reducing a size of decoupling capacitor for a reference voltage generator.

The example embodiments may be applied to any electronic devices and systems including a capacitor digital-to-analog converter and/or an analog-to-digital converter. For example, the inventive concepts may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a communication device, an automotive driving device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concepts.

What is claimed is:

1. An analog-to-digital converter of successive approximation register (SAR) type configured to perform a binary search conversion to sequentially determine from a most significant bit to a least significant bit of a plurality of bits of a digital output signal corresponding to an analog input signal, comprising:
    a comparator configured to generate a comparison signal by comparing comparison input voltages of comparison input terminals;
    a SAR logic circuit configured to generate a plurality of control signals based on the comparison signal to control the binary search conversion; and
    a capacitor digital-to-analog converter including a plurality of drivers configured to control the comparison input voltages based on a first reference voltage, a second reference voltage lower than the first reference voltage and the plurality of control signals, each driver of the plurality of drivers including a capacitor and a split inverter, a first capacitor node of the capacitor being connected to one of the comparison input terminals, the split inverter including a pull-up unit connected to the first reference voltage and a pull-down unit connected to the second reference voltage, the split inverter driving a second capacitor node of the capacitor by selectively turning on one of the pull-up unit and the pull-down unit, a first one of the pull-up unit and the pull-down unit including a full transistor, a second one of the pull-up unit and the pull-down unit including a first split transistor and a second split transistor.

2. The analog-to-digital converter of claim 1, wherein the full transistor and the first split transistor are turned on complementarily based on each control signal of the plurality of control signals, and the second split transistor is turned on, independently of the first split transistor, based on an impedance control signal.

3. The analog-to-digital converter of claim 2, wherein a first size of the first split transistor is smaller than a full size of the full transistor.

4. The analog-to-digital converter of claim 2, wherein a composite turn-on resistance of the first split transistor and the second split transistor is equal to a turn-on resistance of the full transistor.

5. The analog-to-digital converter of claim 2, wherein the SAR logic circuit is configured to reset the each control signal and the impedance control signal such that the full transistor and the second split transistor are turned off and the first split transistor is turned on before the binary search conversion.

6. The analog-to-digital converter of claim 5, wherein the SAR logic circuit is configured to:
maintain a logic level of the impedance control signal such that the second split transistor maintains a reset state where the second split transistor is turned off, when a logic level of the each control signal is transitioned by the binary search conversion; and
transition the logic level of the impedance control signal such that the second split transistor is turned on, when the logic level of the each control signal is maintained by the binary search conversion.

7. The analog-to-digital converter of claim 1, wherein the plurality of drivers are grouped into a plurality of driver pairs, each driver pair corresponding to each bit of the digital output signal, each driver pair includes a positive driver and a negative driver, the positive driver is connected to a positive input terminal of the comparison input terminals and includes a positive split inverter, and the negative driver is connected to a negative input terminal of the comparison input terminals and includes a negative split inverter.

8. The analog-to-digital converter of claim 7, wherein both of the positive split inverter and the negative split inverter included in the same driver pair is implemented with N-type split inverters or P-type split inverters where the N-type split inverter includes the pull-up unit including a full P-type metal oxide semiconductor (PMOS) transistor and the pull-down unit including a first split N-type metal oxide semiconductor (NMOS) transistor and a second split NMOS transistor, and the P-type split inverter includes the pull-up unit including a first split PMOS transistor and a second split PMOS transistor and the pull-down unit including a full NMOS transistor.

9. The analog-to-digital converter of claim 7, wherein the full transistor and the first split transistor that are included in the positive split inverter are complementarily turned on based on each positive control signal of the plurality of control signals,
wherein the full transistor and the first split transistor that are included in the negative split inverter are complementarily turned on based on each negative control signal of the plurality of control signals,
wherein the second split transistor that is included in the positive split inverter is turned on based on an inversion signal of the each negative control signal, and
wherein the second split transistor that is included in the negative split inverter is turned on based on an inversion signal of the each positive control signal.

10. The analog-to-digital converter of claim 9, wherein the SAR logic circuit is configured to reset the each positive control signal and the negative control signals such that the full transistors and the second split transistors that are included in the positive split inverter and the negative split inverter are turned off and the first split transistors that are included in the positive split inverter and the negative split inverter are turned on before the binary search conversion.

11. The analog-to-digital converter of claim 9, wherein the SAR logic circuit is configured to:
reset the positive control signal and the negative control signal to a same logic level before the binary search conversion; and
transition selectively one of the positive control signal and the negative control signal by the binary search conversion.

12. The analog-to-digital converter of claim 1, further comprising:
at least one input switch configured to be turned on to apply the analog input signal to at least one of the comparison input terminals during a sampling period and configured to be turned off during a conversion period while the binary search conversion is performed.

13. The analog-to-digital converter of claim 1, wherein the analog input signal is a differential signal including a positive input signal and a negative input signal,
the analog-to-digital converter further comprising:
a positive input switch configured to be turned on to apply the positive input signal to a positive input terminal of the comparison input terminals during a sampling period and configured to be turned off during a conversion period while the binary search conversion is performed; and
a negative input switch configured to be turned on to apply the negative input signal to a negative input terminal of the comparison input terminals during the sampling period and configured to be turned off during the conversion period.

14. The analog-to-digital converter of claim 1, wherein the analog input signal is a single-ended signal,
the analog-to-digital converter further comprising:
a positive input switch configured to be turned on to apply the single-ended signal to a positive input terminal of the comparison input terminals during a sampling period and configured to be turned off during a conversion period while the binary search conversion is performed; and
a negative input switch configured to be turned on to apply a voltage having a constant voltage level to a negative input terminal of the comparison input terminals during the sampling period and configured to be turned off during the conversion period.

15. The analog-to-digital converter of claim 1, wherein the split inverter includes:
a full PMOS transistor connected between the first reference voltage and the second capacitor node and including a gate electrode receiving each control signal of the plurality of control signals;
a first split NMOS transistor connected between the second reference voltage and the second capacitor node and including a gate electrode receiving the each control signal; and
a second split NMOS transistor connected between the second reference voltage and the second capacitor node and including a gate electrode receiving an impedance control signal.

16. The analog-to-digital converter of claim 15, wherein the SAR logic circuit is configured to reset the each control signal to a logic high level and reset the impedance control signal to a logic low level such that the full PMOS transistor and the second split NMOS transistor are turned off and the first split NMOS transistor is turned on before the binary search conversion.

17. The analog-to-digital converter of claim 1, wherein the split inverter includes:
a first split PMOS transistor connected between the first reference voltage and the second capacitor node and including a gate electrode receiving each control signal of the plurality of control signals; and a second split PMOS transistor connected between the first reference voltage and the second capacitor node and including a gate electrode receiving the impedance control signal; and a full NMOS transistor connected between the second reference voltage and the second capacitor node and including a gate electrode receiving the each control signal.

18. The analog-to-digital converter of claim 17, wherein the SAR logic circuit is configured to reset the each control signal to a logic low level and reset the impedance control signal to a logic high level such that the full NMOS transistor and the second split PMOS transistor are turned off and the first split PMOS transistor is turned on before the binary search conversion.

19. A capacitor digital-to-analog converter included in an analog-to-digital converter of successive approximation register (SAR) type configured to perform a binary search conversion to sequentially determine from a most significant bit to a least significant bit of a plurality of bits of a digital output signal corresponding to an analog input signal, comprising:

a plurality of drivers, each driver of the plurality of drivers including a capacitor and a split inverter, a first capacitor node of the capacitor being connected to a control node, the split inverter including a pull-up unit connected to a first reference voltage and a pull-down unit connected to a second reference voltage lower than the first reference voltage, the split inverter driving a second capacitor node of the capacitor by selectively turning on one of the pull-up unit and the pull-down unit, a first one of the pull-up unit and the pull-down unit including a full transistor, a second one of the pull-up unit and the pull-down unit including a first split transistor and a second split transistor.

20. A split inverter comprising:

a pull-up unit connected between a first reference voltage and an output node; and a pull-down unit connected between a second reference voltage lower than the first reference voltage and the output node, wherein a first one of the pull-up unit and the pull-down unit includes a full transistor, and a second one of the pull-up unit and the pull-down unit includes a first split transistor and a second split transistor, and wherein the full transistor and the first split transistor are turned on complementarily based on a control signal, and the second split transistor is turned on, independently of the first split transistor, based on an impedance control signal.

* * * * *